(12) United States Patent
Lim et al.

(10) Patent No.: US 12,707,842 B2
(45) Date of Patent: Aug. 11, 2026

(54) DISPLAY DEVICE

(71) Applicant: Samsung Display Co., Ltd., Yongin-Si (KR)

(72) Inventors: Jaekeun Lim, Yongin-si (KR); Bon-Seog Gu, Yongin-si (KR); Jinyoung Roh, Yongin-si (KR); Hae-Kwan Seo, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 381 days.

(21) Appl. No.: 18/510,659

(22) Filed: Nov. 16, 2023

(65) Prior Publication Data

US 2024/0196677 A1 Jun. 13, 2024

(30) Foreign Application Priority Data

Dec. 7, 2022 (KR) ........................ 10-2022-0169940

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0819* (2013.01); *G09G 2300/0842* (2013.01); *G09G 2330/021* (2013.01)

(58) Field of Classification Search
CPC ............... H10K 59/131; G09G 3/3233; G09G 2300/0426
See application file for complete search history.

(56) References Cited

U.S. PATENT DOCUMENTS

| | | | | |
|---|---|---|---|---|
| 10,312,309 | B2 * | 6/2019 | Lin ...................... | G09G 3/3233 |
| 2021/0265430 | A1 | 8/2021 | Chang et al. | |
| 2021/0375215 | A1 * | 12/2021 | Cho ..................... | H10K 59/131 |
| 2022/0115478 | A1 | 4/2022 | Nam et al. | |

FOREIGN PATENT DOCUMENTS

| | | | |
|---|---|---|---|
| CN | 111951727 | A | 11/2020 |
| KR | 10-2022-0048519 | A | 4/2022 |

* cited by examiner

*Primary Examiner* — Dale E Page
*Assistant Examiner* — Wilner Jean Baptiste
(74) *Attorney, Agent, or Firm* — Innovation Counsel LLP

(57) ABSTRACT

Disclosed is a display device including a display panel that includes a first area and a second area. The second area is divided into a first side area and a second side area around a central axis. The display panel includes a first side normal pixel disposed in each of first and second rows of the first side area, a first side non-normal pixel disposed in the second row among the first and second rows of the first side area, a second side normal pixel disposed in each of first and second rows of the second side area, and a second side non-normal pixel disposed in the first row among the first and second rows of the second side area. Each of the first side non-normal pixel and the second side non-normal pixel further includes a connection wiring connecting a data line and a pixel circuit to each other.

22 Claims, 13 Drawing Sheets

B10
A1
A2
PDL
PDL2
PDL1
EP
TP
PX1r
PX1b
PX1g
PXU1
I'
I
PXA1r
PXA1g
PXA1b
PXA2b
PXA2g
PXA2r
PX2r
PX2g
PX2b
PXU2
DR1
DR2
DR3

B21
PCR10
PCG10
PCB11
PCG11
PCR11
PCG12
DLR0
DLG0
DLB1
DLG1
DLR1
DLG2
B_AE11
B_EL11
R_EL11
R_AE11
G_AE11
G_EL12
G_AE12
R_AE21
R_EL21
G_EL11
R_CL1
B_EL21
B_AE21
B_CL1
PCR20
PCG20
PCB21
PCG21
PCR21
PCG22
G_AE21
G_EL21
G_AE22
G_EL22
PCR20
R_AE21
R_EL21
R_CL1
PXr21
PCB21
B_AE21
B_EL21
B_CL1
PXb21
PCG21
G_AE21
G_EL21
PXg21
PCG22
G_AE22
G_EL22
PXg22
PCR11
R_AE11
R_EL11
PXr11
PCG11
G_AE11
G_EL11
PXg11
PCB11
B_AE11
B_EL11
PXb11
PCG12
G_AE12
G_EL12
PXg12

B22
PCR2k-1
R_AE2k
R_EL2k
R_CL2
PXr2k
PCB2k
B_AE2k
B_EL2k
B_CL2
PXb2k
PCG2k
G_AE2k
G_EL2k
PXg2k
PCG2k+1
G_AE2k+1
G_EL2k+1
PXg2k+1
PCR1k
R_AE1k
R_EL1k
PXr1k
PCG1k
G_AE1k
G_EL1k
PXg1k
PCB1k
B_AE1k
B_EL1k
PXb1k
PCG1k+1
G_AE1k+1
G_EL1k+1
PXg1k+1
PCR1k-1
DLRk-1
PCG1k-1
DLGk-1
DLBk
DLGk
DLRk
DLGk+1
PCR2k-1
PCG2k-1

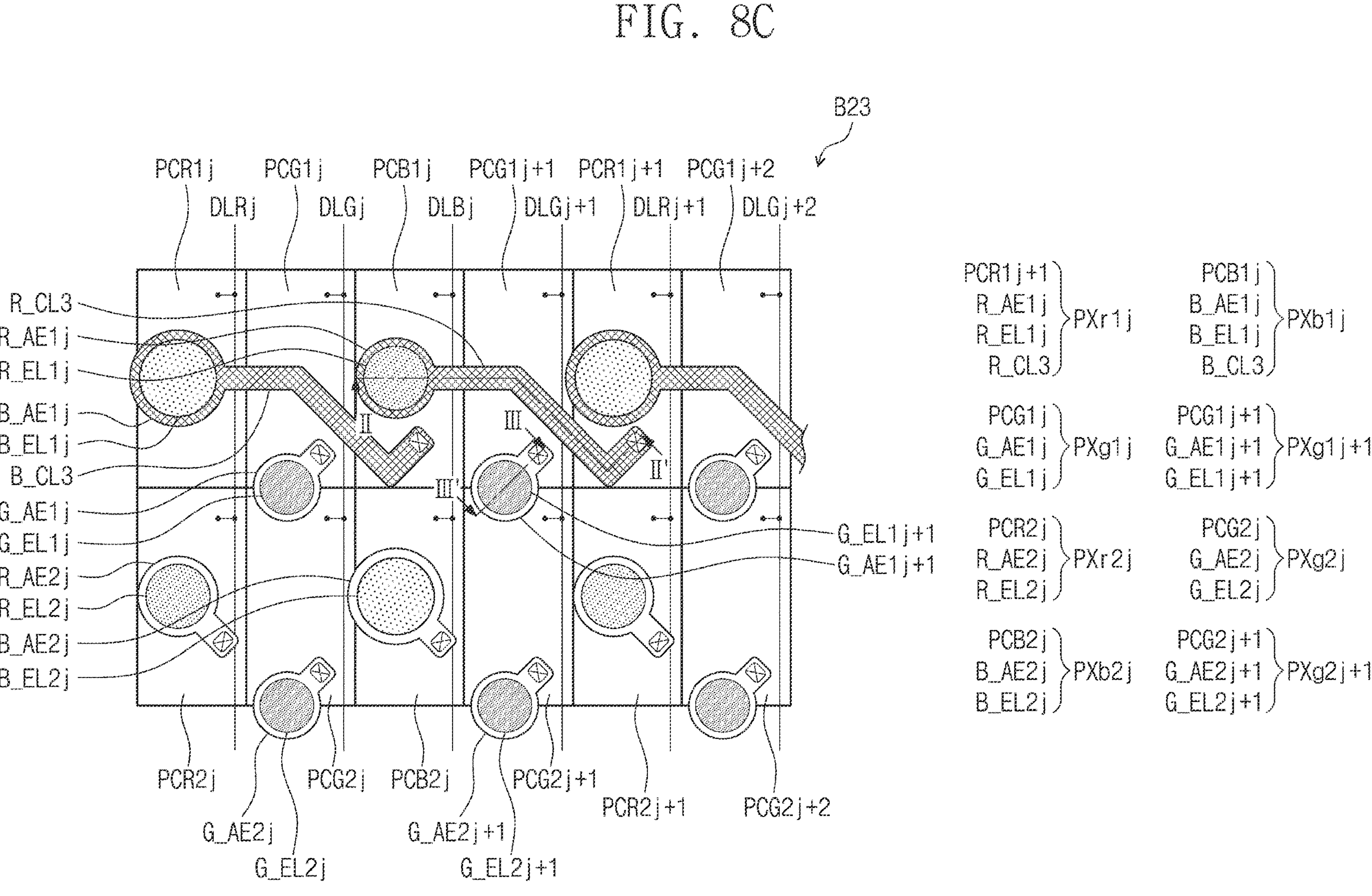
FIG. 8C
B23
PCR1j
PCG1j
PCB1j
PCG1j+1
PCR1j+1
PCG1j+2
DLRj
DLGj
DLBj
DLGj+1
DLRj+1
DLGj+2
R_CL3
R_AE1j
R_EL1j
B_AE1j
B_EL1j
B_CL3
G_AE1j
G_EL1j
R_AE2j
R_EL2j
B_AE2j
B_EL2j
II
II'
III
III'
G_EL1j+1
G_AE1j+1
PCR2j
PCG2j
PCB2j
PCG2j+1
PCR2j+1
PCG2j+2
G_AE2j
G_EL2j
G_AE2j+1
G_EL2j+1
PCR1j+1
R_AE1j
R_EL1j
R_CL3
PXr1j
PCB1j
B_AE1j
B_EL1j
B_CL3
PXb1j
PCG1j
G_AE1j
G_EL1j
PXg1j
PCG1j+1
G_AE1j+1
G_EL1j+1
PXg1j+1
PCR2j
R_AE2j
R_EL2j
PXr2j
PCG2j
G_AE2j
G_EL2j
PXg2j
PCB2j
B_AE2j
B_EL2j
PXb2j
PCG2j+1
G_AE2j+1
G_EL2j+1
PXg2j+1

DM
DP
300
ISP
140
130
120
330
323
311
240
230
220
210
143
142
141
PDL1
80
70
PC3
60
50
40
30
20
10
10br
110
I'
I
CE20
CE10
Cst
SCP1
SE1
GT1
AC1
DE1
S-TFT
BML.a
BML.b
B1_PDC
CNE2
CNE1
SCP2
SE2
AC2
GT2
DE2
O-TFT
BML2_C
PDL_OP1
B1_ED
B1_AE
B1_EL
B1_CE
311_OP1
EP
TP
IL_OP
DR3

DM
300
ISP
140
130
120
330
322
312
240
230
220
210
143
142
141
PDL_OP2
PDL2
80
70
60
50
40
30
20
10
10br
110
III'
III
II'
II
G2_ED
G_AE1j+1
G_EL1j+1
G2_CE
312_OP2
PCG1j+1
BMLa
PCR1j+1
R_CL3
321
R2_ED
R_AE1j
R_EL1j
R2_CE
PDL_OP2
DR3

DISPLAY DEVICE

CROSS-REFERENCE TO RELATED APPLICATIONS

This application claims priority under 35 U.S.C. § 119 to Korean Patent Application No. 10-2022-0169940 filed on Dec. 7, 2022, in the Korean Intellectual Property Office, the disclosures of which are incorporated by reference herein in their entireties.

BACKGROUND

The present disclosure relates to a display device, and more particularly, to a display device capable of reducing power consumption.

A display device may be composed of a display module for displaying an image and various electronic components such as an electronic optical module. The electronic components may be electrically connected to each other via signal lines. The electronic optical module may include a camera, an infrared detection sensor, a proximity sensor, etc.

The electronic optical module may be disposed under the display module. The display module may include an active area where an image is displayed and a peripheral area adjacent to the active area. The electronic optical module may be disposed under the peripheral area.

The display module includes a plurality of pixels for generating an image and a driver for driving the pixels. Each pixel includes a light-emitting element and a pixel circuit connected to the light-emitting element. The pixel circuit may be driven by a driver to cause the light-emitting element to emit light.

An arrangement design (i.e., a layout) of the pixel circuit and the light-emitting element is being developed to maximize light-emitting efficiency while increasing resolution in a limited space.

SUMMARY

Embodiments of the present disclosure may provide a display device capable of reducing complexity of a pixel layout around a sensing area while reducing power consumption.

According to an embodiment, a display device includes a display panel including a display area including a first area and a second area adjacent to the first area, wherein the second area is divided into a first side area and a second side area around a central axis passing through a center of the first area.

The display panel includes a first side data line disposed in the first side area, a second side data line disposed in the second side area, a first side pixel circuit electrically connected to the first side data line, a second side pixel circuit electrically connected to the second side data line, a first additional data line disposed in the first side area such that a spacing between the central axis and the first additional data line is larger than a spacing between the central axis and the first side data line, a second additional data line disposed in the second side area such that a spacing between the central axis and the second additional data line is larger than a spacing between the central axis and the second side data line, a first additional pixel circuit electrically connected to the first additional data line, a second additional pixel circuit electrically connected to the second additional data line, a first additional light-emitting element connected to the first additional pixel circuit via a first connection wiring, and a second additional light-emitting element connected to the second additional pixel circuit via a second connection wiring.

According to an embodiment, a display device includes a display panel including a display area including a first area and a second area adjacent to the first area, wherein the second area is divided into a first side area and a second side area around a central axis passing through a center of the first area.

The display panel includes a first side normal pixel disposed in each of first and second rows of the first side area, a first side non-normal pixel disposed in the second row among the first and second rows of the first side area, a second side normal pixel disposed in each of first and second rows of the second side area, and a second side non-normal pixel disposed in the first row among the first and second rows of the second side area.

Each of the first side non-normal pixel and the second side non-normal pixel further includes a connection wiring connecting a data line and a pixel circuit to each other, wherein each of the first side normal pixel and the second side normal pixel is free of the connection wiring.

According to an embodiment, a display device includes a display panel including a display area including a first area and a second area adjacent to the first area, wherein the second area is divided into a first side area and a second side area around a central axis passing through a center of the first area.

The display panel includes a first side pixel circuit disposed in the first side area, a second side pixel circuit disposed in the second side area, a first light-emitting element disposed in the first side area and connected to the first pixel circuit via a first connection wiring, wherein a spacing between the central axis and the first light-emitting element is larger than a spacing between the central axis and the first side pixel circuit, and a second light-emitting element disposed in the second side area and connected to the second pixel circuit via a second connection wiring, wherein a spacing between the central axis and the second light-emitting element is larger than a spacing between the central axis and the second side pixel circuit.

The first connection wiring extends in a first extension direction so as to extend away from the central axis, wherein the second connection wiring extends in a second extension direction so as to extend away from the central axis, wherein the second extension direction is opposite to the first extension direction.

BRIEF DESCRIPTION OF THE FIGURES

The above and other objects and features of the present disclosure will become apparent by describing in detail embodiments thereof with reference to the accompanying drawings.

FIG. 8C is an enlarged view showing a pixel arrangement of a third portion shown in each of FIGS. 6A and 6B.

DETAILED DESCRIPTION

Figure 1:
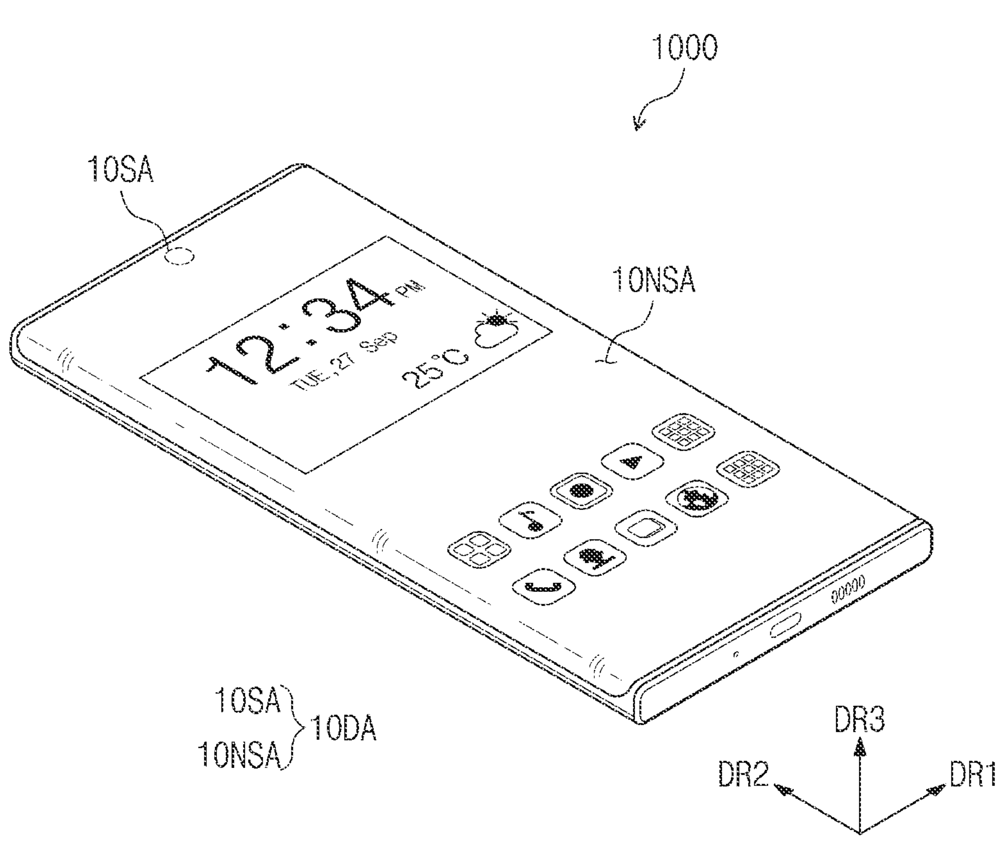
FIG. 1 is a perspective view of a display device according to an embodiment of the present disclosure.

As used herein, when a component (or a region, a layer, a portion, and the like) is referred to as being "on", "connected to", or "coupled to" another component, it means that the component may be directly disposed, connected, or coupled on or to another component or a third component may be disposed between the component and the other component.

Like reference numerals refer to like components. In addition, in the drawings, thicknesses, ratios, and dimensions of components are exaggerated for effective description of technical content.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

Terms such as first, second, and the like may be used to describe various components, but the components should not be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components illustrated in the drawings. The above terms are relative concepts, and are described with reference to directions indicated in the drawings.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to drawings.

FIG. 1 is a perspective view of a display device according to an embodiment of the present disclosure.

Referring to FIG. 1, a display device 1000 may be a device activated according to an electrical signal. For example, the display device 1000 may be a mobile phone, a tablet, a monitor, a television, a car navigation system, a game console, or a wearable device. FIG. 1 shows that the display device 1000 is a mobile phone by way of example. However, the present disclosure is not limited thereto.

The display device 1000 may display an image on a display area 10DA. The display area 10DA may include a plane defined by a first direction DR1 and a second direction DR2. The display area 10DA may further include curved surfaces respectively bent from at least two sides of the plane. However, a shape of the display area 10DA is not limited thereto. For example, the display area 10DA may include only the plane. Alternatively, the display area 10DA may further include four curved surfaces respectively bent from at least two sides, for example, four sides of the plane.

A first area of the display area 10DA may be defined as a sensing area 10SA. FIG. 1 shows one sensing area 10SA by way of example, but the number of sensing areas 10SA is not limited thereto. The sensing area 10SA may be a portion of the display area 10DA, and may have higher transmittance of an optical signal than that of a second area of the display area 10DA. The second area of the display area 10DA may be referred to as a non-sensing area 10NSA. The sensing area 10SA may have higher light transmittance than that of the non-sensing area 10NSA. Accordingly, the display device 1000 may display an image on the sensing area 10SA and may receive or transmit the optical signal through the sensing area 10SA.

The display device 1000 may include an electronic optical module disposed in an area overlapping the sensing area 10SA. The electronic optical module may receive the optical signal provided from an outside through the sensing area 10SA or output the optical signal through the sensing area 10SA. For example, the electronic optical module may be a camera module, a sensor that measures a distance between an object and a mobile phone, such as a proximity sensor, a sensor that recognizes a portion (e.g., a fingerprint, an iris, or a face) of a user's body, or a small lamp that outputs light. However, the present disclosure is not particularly limited thereto.

A thickness direction of the display device 1000 may be a third direction DR3, which is a normal direction to the display area 10DA. A front surface (or an upper surface) and a rear surface (or a lower surface) of each of members constituting the display device 1000 may be defined based on the third direction DR3.

Figure 2:
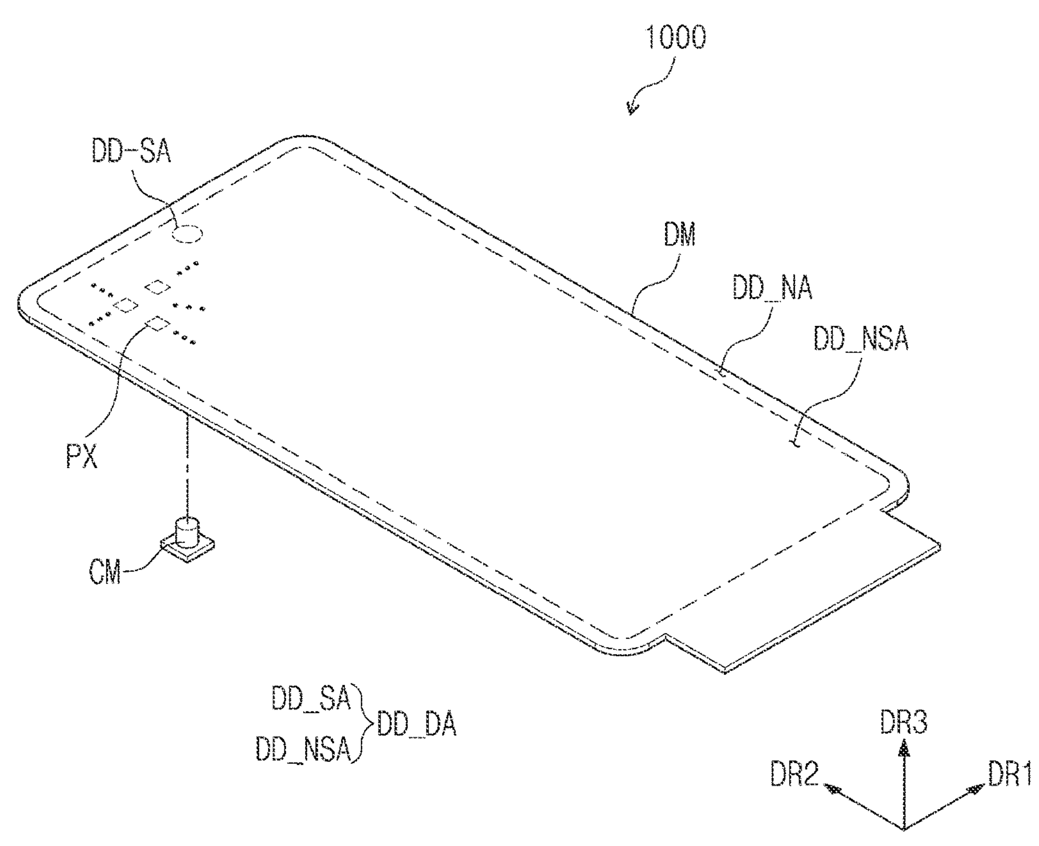
FIG. 2 is an exploded perspective view showing some components of a display device according to an embodiment of the present disclosure.

FIG. 2 is an exploded perspective view showing some components of a display device according to an embodiment of the present disclosure.

Referring to FIG. 2, the display device 1000 may include a display module DM and a camera module CM. The display module DM may generate an image and detect an external input. The camera module CM is disposed under the display module DM. The display module DM may be referred to as a first electronic module constituting the display device 1000, and the camera module CM may be referred to as a second electronic module or electronic optical module.

The display module DM may include a display area DD_DA and a peripheral area DD_NA. The display area DD_DA may correspond to the display area 10DA shown in FIG. 1. The display area DD_DA may include a first area DD_SA and a second area DD_NSA. The first area DD_SA of the display area DD_DA may be defined as a sensing area, and the sensing area DD_SA may have higher transmittance that that of the second area DD_NSA (hereinafter, a non-sensing area or a normal area of the display area DD_DA). Accordingly, the sensing area DD_SA may provide external natural light to the camera module CM. Because the sensing area DD_SA is a portion of the display area DD_DA, an image may be displayed on the sensing area DD_SA.

A pixel PX is disposed in the display area DD_DA. A light-emitting element is disposed in the display area DD_DA, and no light-emitting element is disposed in the peripheral area DD_NA. The pixel PX is disposed in each of the sensing area DD_SA and the normal area DD_NSA. However, configurations of the pixels PX respectively disposed in the sensing area DD_SA and the normal area DD_NSA may be different from each other. A detailed description thereof will be described later.

Figure 3:
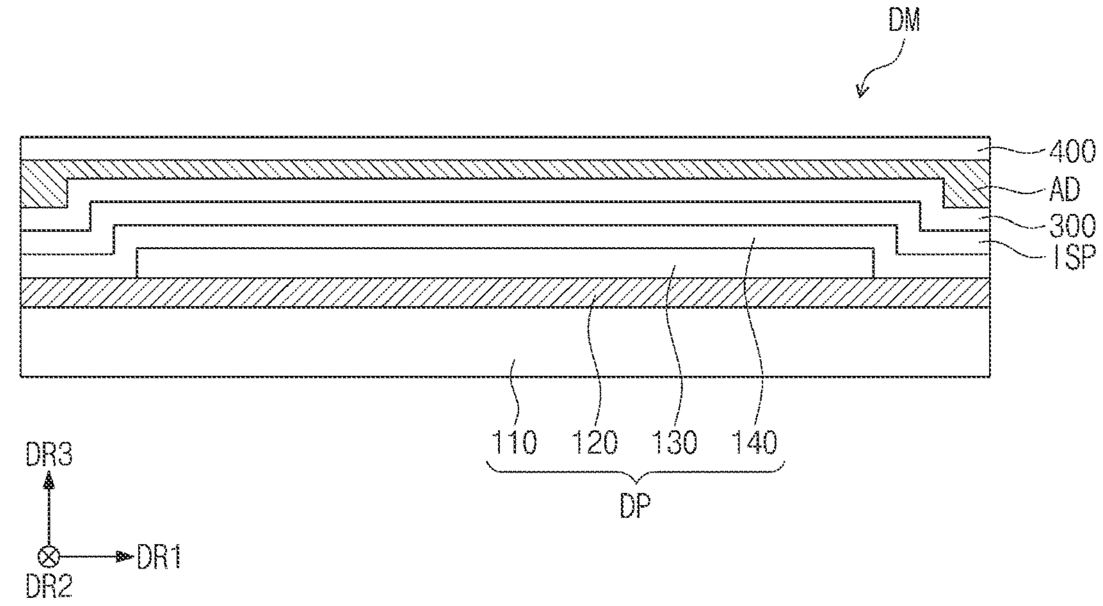
FIG. 3 is a cross-sectional view of a display module according to an embodiment of the present disclosure.

FIG. 3 is a cross-sectional view of a display module according to an embodiment of the present disclosure.

Referring to FIG. 3, the display module DM may include a display panel DP, an input sensor layer ISP, an anti-reflective layer 300, and a window 400. The anti-reflective layer 300 and the window 400 may be coupled to each other via an adhesive layer AD.

The display panel DP may be a component that substantially generates an image. The display panel DP may be a light-emitting display panel. For example, the display panel DP may be an organic light-emitting display panel, an inorganic light-emitting display panel, a micro LED display panel, or a nano LED display panel. The display panel DP may be referred to as a display layer.

The display panel DP may include a base layer 110, a circuit layer 120, a light-emitting element layer 130, and an encapsulation layer 140.

The base layer 110 may be a member providing a base surface on which the circuit layer 120 is disposed. The base layer 110 may be a rigid substrate or a flexible substrate capable of being bent, folded, or rolled. The base layer 110 may be a glass substrate, a metal substrate, or a polymer substrate. However, an embodiment of the present disclosure is not limited thereto, and the base layer 110 may be an inorganic layer, an organic layer, or a composite material layer.

The base layer 110 may have a multilayer structure. For example, the base layer 110 may include a first synthetic resin layer, an inorganic layer disposed on first synthetic resin layer and having a multi-layer or single-layer structure, and a second synthetic resin layer disposed on the inorganic layer. Each of the first and second synthetic resin layers may include a polyimide-based resin. However, the present disclosure is not particularly limited thereto.

The circuit layer 120 may be disposed on the base layer 110. The circuit layer 120 may include an insulating layer, a semiconductor pattern, a conductive pattern, a signal line, etc.

The light-emitting element layer 130 may be disposed on the circuit layer 120. The light-emitting element layer 130 may include a light-emitting element. For example, the light-emitting element may include an organic light-emitting material, an inorganic light-emitting material, an organic-inorganic light-emitting material, a quantum dot, a quantum rod, a micro LED, or a nano LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include at least one inorganic layer. The encapsulation layer 140 may include a stack structure of an inorganic layer, an organic layer, and an inorganic layer.

The input sensor layer ISP may be disposed on the display panel DP. The input sensor layer ISP may detect an external input applied from the outside. The external input may be a user's input. The user's input may include various types of external inputs such as a portion of the user's body, light, heat, a pen, a pressure, etc.

The input sensor layer ISP may be formed on the display panel DP via a consecutive process. In this case, the input sensor layer ISP may be directly disposed on the display panel DP (in particular, the encapsulation layer 140). In this regard, "being directly disposed" may mean that a third component is not disposed between the input sensor layer ISP and the display panel DP. That is, a separate adhesive member may not be disposed between the input sensor layer ISP and the display panel DP.

The anti-reflective layer 300 may be directly disposed on the input sensor layer ISP. The anti-reflective layer 300 may reduce reflectance of external light incident from the outside out of the display device. The anti-reflective layer 300 may be formed on the input sensor layer ISP via a consecutive process. The anti-reflective layer 300 may include color filters. The color filters may have a predetermined arrangement. For example, the color filters may be arranged in consideration of colors of light beams emitted from the pixels included in the display panel DP. Further, the anti-reflective layer 300 may further include a black matrix adjacent to the color filters. A detailed description of the anti-reflective layer 300 will be made later.

In an embodiment of the present disclosure, positions of the input sensor layer ISP and the anti-reflective layer 300 may be interchanged with each other.

In an embodiment of the present disclosure, the display module DM may further include an optical layer disposed on the anti-reflective layer 300. For example, the optical layer may be formed on the anti-reflective layer 300 via a consecutive process. The optical layer may control a direction of light incident from the display panel DP to improve frontward luminance of the display module DM. For example, the optical layer may include an organic insulating layer in which openings are defined in a corresponding manner to light-emitting areas of the pixels included in the display panel DP, and a high refractive index layer covering the organic insulating layer and filling the openings. The high refractive index layer may have a higher refractive index than that of the organic insulating layer.

The window 400 may act as a front surface of the display device 1000 (see FIG. 1). The window 400 may include a glass film or a synthetic resin film as a base film thereof. The window 400 may further include an anti-reflective film or an anti-fingerprint film. The window 400 may include a glass film or a synthetic resin film. The window 400 may further include a bezel pattern overlapping the peripheral area DD_NA (see FIG. 2) of the display module DM.

Figure 4:
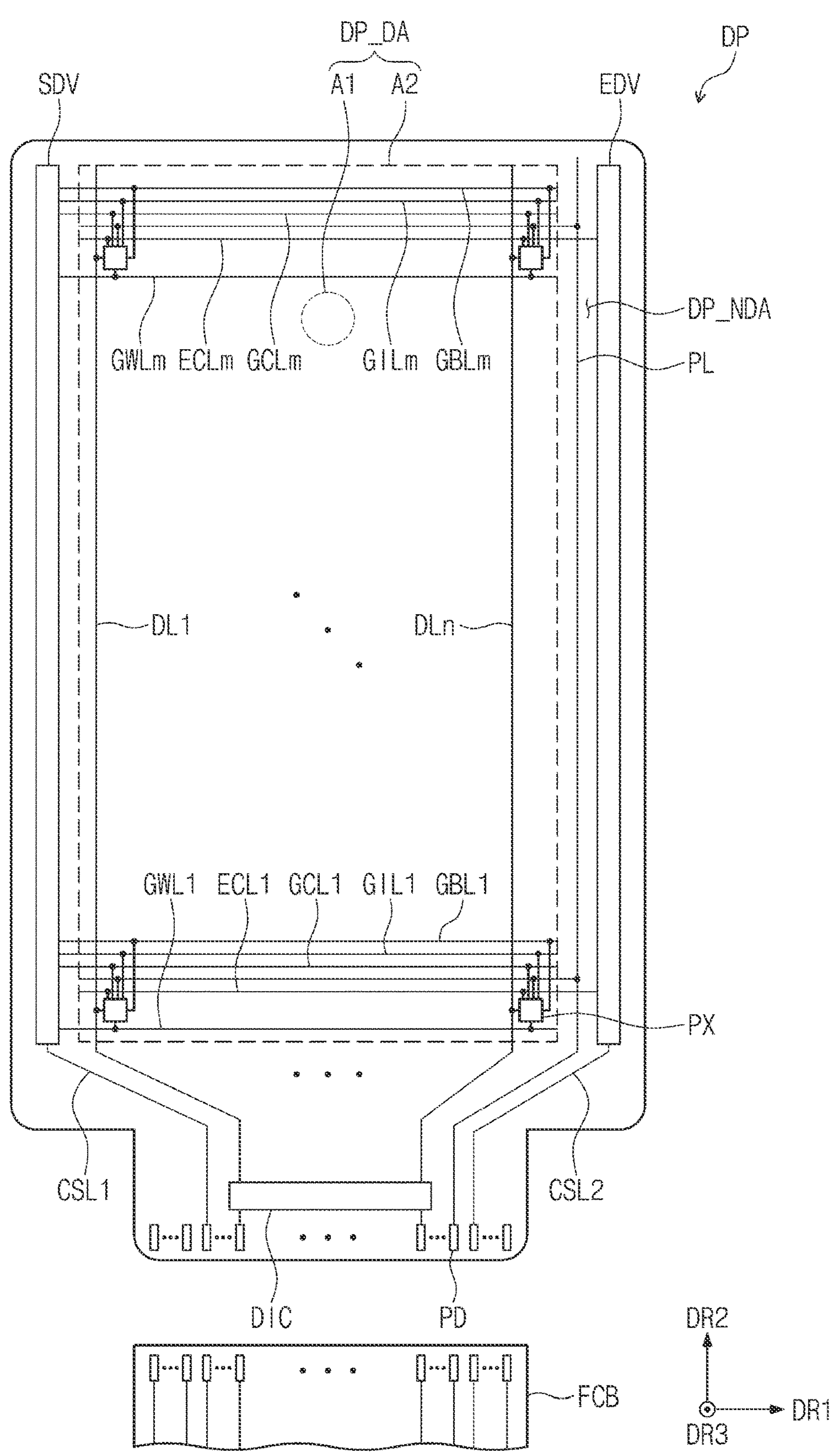
FIG. 4 is a plan view of a display panel according to an embodiment of the present disclosure.

FIG. 4 is a plan view of a display panel according to an embodiment of the present disclosure.

Referring to FIG. 4, a display area DP_DA and a non-display area DP_NDA around the display area DP_DA may be defined in the display panel DP. The display area DP_DA and the non-display area DP_NDA may be distinguished from each other based on presence or absence of the pixel PX therein. The pixel PX is disposed in the display area DP_DA. A scan driver SDV, a data driver, and a light-emission driver EDV may be disposed in the non-display area DP_NDA. The data driver may be a partial circuit included in a driver chip DIC.

The display area DP_DA may include a first area A1 and a second area A2. The first area A1 may be an area corresponding to the sensing area 10SA shown in FIG. 1, and the second area A2 may be an area corresponding to the non-sensing area 10NSA shown in FIG. 1. The first area A1 and the second area A2 may be distinguished from each other based on an arrangement spacing of the pixels PX, a size of the pixel PX, a shape of the pixel PX, or presence or absence of a transmissive area TP (see FIG. 7) therein. A detailed description of the first area A1 and the second area A2 will be made later.

The display panel DP may include the pixels PX, initialization scan lines GIL1 to GILm, compensation scan lines GCL1 to GCLm, write scan lines GWL1 to GWLm, black scan lines GBL1 to GBLm, light-emission control lines ECL1 to ECLm, data lines DL1 to DLn, first and second control lines CSL1 and CSL2, a drive voltage line PL, and a plurality of pads PD. In this regard, each of m and n is a natural number greater than or equal to 2.

The pixels PX may be electrically connected to the initialization scan lines GIL1 to GILm, the compensation scan lines GCL1 to GCLm, the write scan lines GWL1 to GWLm, the black scan lines GBL1 to GBLm, the light-emission control lines ECL1 to ECLm, and the data lines DL1 to DLn.

The initialization scan lines GIL1 to GILm, the compensation scan lines GCL1 to GCLm, the write scan lines GWL1 to GWLm, and the black scan lines GBL1 to GBLm may extend in the first direction DR1 and may be electrically connected to the scan driver SDV. The data lines DL1 to DLn may extend in the second direction DR2 and be electrically connected to the driver chip DIC. The light-emission control lines ECL1 to ECLm may extend in the first direction DR1 and be electrically connected to the light-emission driver EDV.

The drive voltage line PL may include a portion extending in the first direction DR1 and a portion extending in the second direction DR2. The portion extending in the first direction DR1 and the portion extending in the second direction DR2 may be disposed on different layers. The drive voltage line PL may provide a drive voltage to the pixels PX.

The first control line CSL1 may be connected to the scan driver SDV, and the second control line CSL2 may be connected to the light-emission driver EDV.

In a plan view, the pads PD may be disposed adjacent to a lower end of the non-display area DP_NDA. The driver chip DIC, the drive voltage line PL, the first control line CSL1, and the second control line CSL2 may be electrically connected to the pads PD. A flexible circuit film FCB may be electrically connected to the pads PD via an anisotropic conductive adhesive layer.

Figure 5:
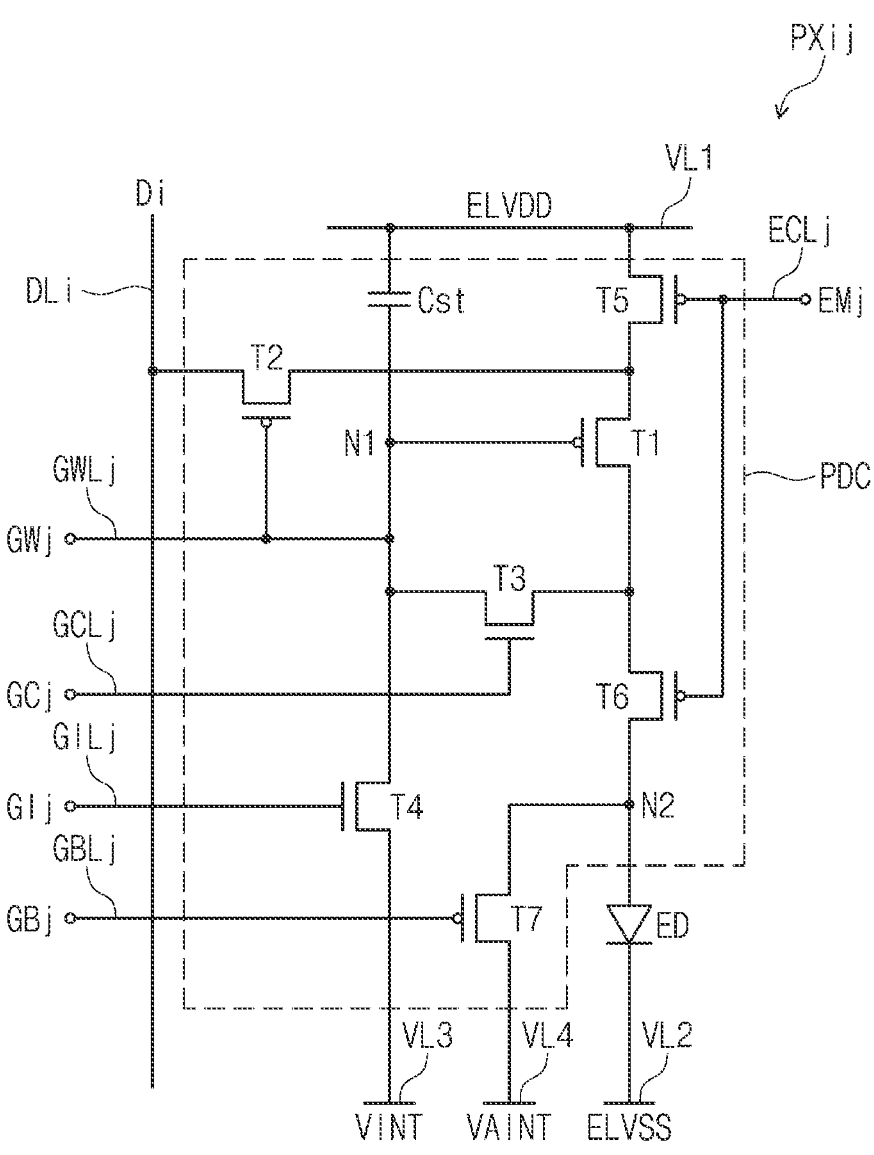
FIG. 5 is a circuit diagram of a pixel according to an embodiment of the present disclosure.

FIG. 5 is an equivalent circuit diagram of a pixel PXij according to an embodiment of the present disclosure.

FIG. 5 shows an equivalent circuit diagram of one pixel PXij among a plurality of pixels PX (see FIG. 4). Because the plurality of pixels PX have the same circuit structure, detailed description of each of the remaining pixels PX is replaced with the description of the circuit structure of the pixel PXij and is omitted.

Referring to FIG. 4 and FIG. 5, the pixel PXij is connected to an i-th data line DLi among the data lines DL1 to DLn, a j-th initialization scan line GILj among the initialization scan lines GIL1 to GILm, a j-th compensation scan line GCLj among the compensation scan lines GCL1 to GCLm, a j-th write scan line GWLj among the write scan lines GWL1 to GWLm, a j-th black scan line GBLj among the black scan lines GBL1 to GBLm, a j-th light-emission control line ECLj among the light-emission control lines ECL1 to ECLm, first and second drive voltage lines VL1 and VL2, and first and second initialization voltage lines VL3 and VL4. i is an integer of 1 to n, and j is an integer of 1 to m.

The pixel PXij includes a light-emitting element ED and a pixel circuit PDC. The light-emitting element ED may be a light-emitting diode. In one example of the present disclosure, the light-emitting element ED may be an organic light-emitting diode including an organic light-emitting layer. However, the present disclosure is not particularly limited thereto. The pixel circuit PDC may control an amount of current flowing in the light-emitting element ED in response to a data signal Di. The light-emitting element ED may emit light at predefined luminance in response to the current amount provided from the pixel circuit PDC.

The pixel circuit PDC may include first to seventh transistors T1, T2, T3, T4, T5, T6, and T7, and at least one capacitor Cst. According to the present disclosure, a configuration of the pixel circuit PDC is not limited to the embodiment as shown in FIG. 5. The pixel circuit PDC as shown in FIG. 5 is only an example, and the configuration of the pixel circuit PDC may be implemented in a modified manner.

At least one of the first to seventh transistors T1, T2, T3, T4, T5, T6, and T7 may be a transistor having a low-temperature polycrystalline silicon LTPS semiconductor layer. At least one of the first to seventh transistors T1, T2, T3, T4, T5, T6, and T7 may be a transistor having an oxide semiconductor layer. For example, the third and fourth transistors T3 and T4 may be oxide semiconductor transistors, and the first, second, fifth, sixth, and seventh transistors T1, T2, T5, T6, and T7 may be LTPS transistors.

Specifically, the first transistor T1 which directly affects brightness of the light-emitting element ED may be configured to include a semiconductor layer composed of highly reliable polycrystalline silicon, and thus, a high-resolution display device may be implemented. In one example, an oxide semiconductor has high carrier mobility and low leakage current. Thus, even when an operation time is large, a voltage drop is not large. That is, because a color change of an image due to a voltage drop is not large even during a low-frequency operation, a low-frequency operation may be realized. In this way, the oxide semiconductor has small leakage current. Thus, at least one of the third transistor T3 or fourth transistor T4 connected to a gate electrode of the first transistor T1 may include the oxide semiconductor, such that leakage current that may flow to the gate electrode may be prevented and at the same time, power consumption may be reduced.

Each of some of the first to seventh transistors T1, T2, T3, T4, T5, T6, and T7 may be a P-type transistor, and each of the remaining ones may be an N-type transistor. For example, each of the first, second, fifth, sixth, and seventh transistors T1, T2, T5, T6, and T7 may be the P-type transistor, and each of the third and fourth transistors T3 and T4 may be the N-type transistor. However, the present disclosure is not limited thereto. For example, all of the first to seventh transistors T1, T2, T3, T4, T5, T6, and T7 may be P-type transistors or N-type transistors. Alternatively, each of the first, second, fifth, and sixth transistors T1, T2, T5, and T6 may be the P-type transistor, and each of the third, fourth, and seventh transistors T3, T4, and T7 may be the N-type transistor.

The j-th initialization scan line GILj, the j-th compensation scan line GCLj, the j-th write scan line GWLj, the j-th black scan line GBLj and the j-th light-emission control line ECLj may respectively transfer a j-th initialization scan signal GIj, a j-th compensation scan signal GCj, a j-th write scan signal GWj, a j-th black scan signal GBj and a j-th light-emission control signal EMj to the pixel PXij. The i-th data line DLi transfers the i-th data signal Di to the pixel PXij. The i-th data signal Di may have a voltage level corresponding to an image signal input to the display device 1000 refer to FIG. 1.

The first and second drive voltage lines VL1 and VL2 may transfer a first drive voltage ELVDD and a second drive voltage ELVSS to the pixel PXij, respectively. Further, the first and second initialization voltage lines VL3 and VL4 may transfer a first initialization voltage VINT and a second initialization voltage VAINT to the pixel PXij, respectively. The first and second drive voltage lines VL1 and VL2 and the first and second initialization voltage lines VL3 and VL4 may be included in the drive voltage line PL shown in FIG. 4.

The first transistor T1 is connected to and disposed between the first drive voltage line VL1 receiving the first drive voltage ELVDD and the light-emitting element ED. The first transistor T1 includes a first electrode (i.e. a source or drain electrode) connected to the first drive voltage line VL1 via the fifth transistor T5, a second electrode (i.e. a drain or source electrode) connected to a pixel electrode (also referred to as an anode) of the light-emitting element ED via the sixth transistor T6, and a third electrode (i.e. a gate electrode) connected to one end (e.g., a first node N1) of the capacitor Cst. The first transistor T1 may receive the i-th data signal Di transmitted from the i-th data line DLi under a switching operation of the second transistor T2 to supply a drive current to the light-emitting element ED.

The second transistor T2 is connected to and disposed between the data line DLi and the first electrode of the first transistor T1. The second transistor T2 includes a first electrode (i.e. a source or drain electrode) connected to the data line DLi, a second electrode (i.e. a drain or source electrode) connected to the first electrode of the first transistor T1, and a third electrode (i.e. a gate electrode) connected to the j-th write scan line GWLj. The second transistor T2 may be turned on based on the write scan signal GWj received from the j-th write scan line GWLj to transmit the i-th data signal Di delivered from the i-th data line DLi to the first electrode of the first transistor T1.

The third transistor T3 is connected to and disposed between the second electrode of the first transistor T1 and the first node N1. The third transistor T3 includes a first electrode (i.e. a source or drain electrode) connected to the third electrode of the first transistor T1, a second electrode (i.e. a drain or source electrode) connected to the second electrode of the first transistor T1, and a third electrode (i.e. a gate electrode) connected to the j-th compensation scan line GCLj. The third transistor T3 may be turned on based on the j-th compensation scan signal GCj received from the j-th compensation scan line GCLj to connect the third electrode of the first transistor T1 and the second electrode of the first transistor T1 to each other such that the first transistor T1 may be conductive in a diode manner.

The fourth transistor T4 is connected to and disposed between the first node N1 and the first initialization voltage line VL3 to which the first initialization voltage VINT is applied. The fourth transistor T4 includes a first electrode (i.e. a source or drain electrode) connected to the first initialization voltage line VL3 to which the first initialization voltage VINT is delivered, a second electrode (i.e. a drain or source electrode) connected to the first node N1, and a third electrode (i.e. a gate electrode) connected to the j-th initialization scan line GILj. The fourth transistor T4 may be turned on based on the j-th initialization scan signal GIj received from the j-th initialization scan line GILj. The turned-on fourth transistor T4 may transfer the first initialization voltage VINT to the first node N1 to initialize a potential (that is, a potential of the first node N1) of the third electrode of the first transistor T1.

The fifth transistor T5 includes a first electrode (i.e. a source or drain electrode) connected to the first drive voltage line VL1, a second electrode (i.e. a drain or source electrode) connected to the first electrode of the first transistor T1, and a third electrode (i.e. a gate electrode) connected to the j-th light-emission control line ECLj. The sixth transistor T6 includes a first electrode connected to the second electrode of the first transistor T1, a second electrode connected to the pixel electrode of the light-emitting element ED, and the third electrode (e.g., a gate electrode) connected to the j-th light-emission control line ECLj.

The fifth and sixth transistors T5 and T6 are simultaneously turned on based on the j-th light-emission control signal EMj transmitted from the j-th light-emission control line ECLj. The first drive voltage ELVDD applied via the turned-on fifth transistor T5 may be compensated via the first transistor T1 conductive in the diode manner, and then may be transmitted to the light-emitting element ED via the sixth transistor T6.

The seventh transistor T7 includes a first electrode (i.e. a source or drain electrode) connected to the second initialization voltage line VL4 to which the second initialization voltage VAINT is transmitted, a second electrode (i.e. a drain or source electrode) connected to the second electrode of the sixth transistor T6, and a third electrode (i.e. a gate electrode) connected to the black scan line GBLj. The second initialization voltage VAINT may have a voltage level lower than or equal to the first initialization voltage VINT.

One end of the capacitor Cst is connected to the third electrode of the first transistor T1, and the other end of the capacitor Cst is connected to the first drive voltage line VL1. A cathode of the light-emitting element ED may be connected to the second drive voltage line VL2 delivering the second drive voltage ELVSS. The second drive voltage ELVSS may have a lower voltage level than the first drive voltage ELVDD.

Figure 6A:
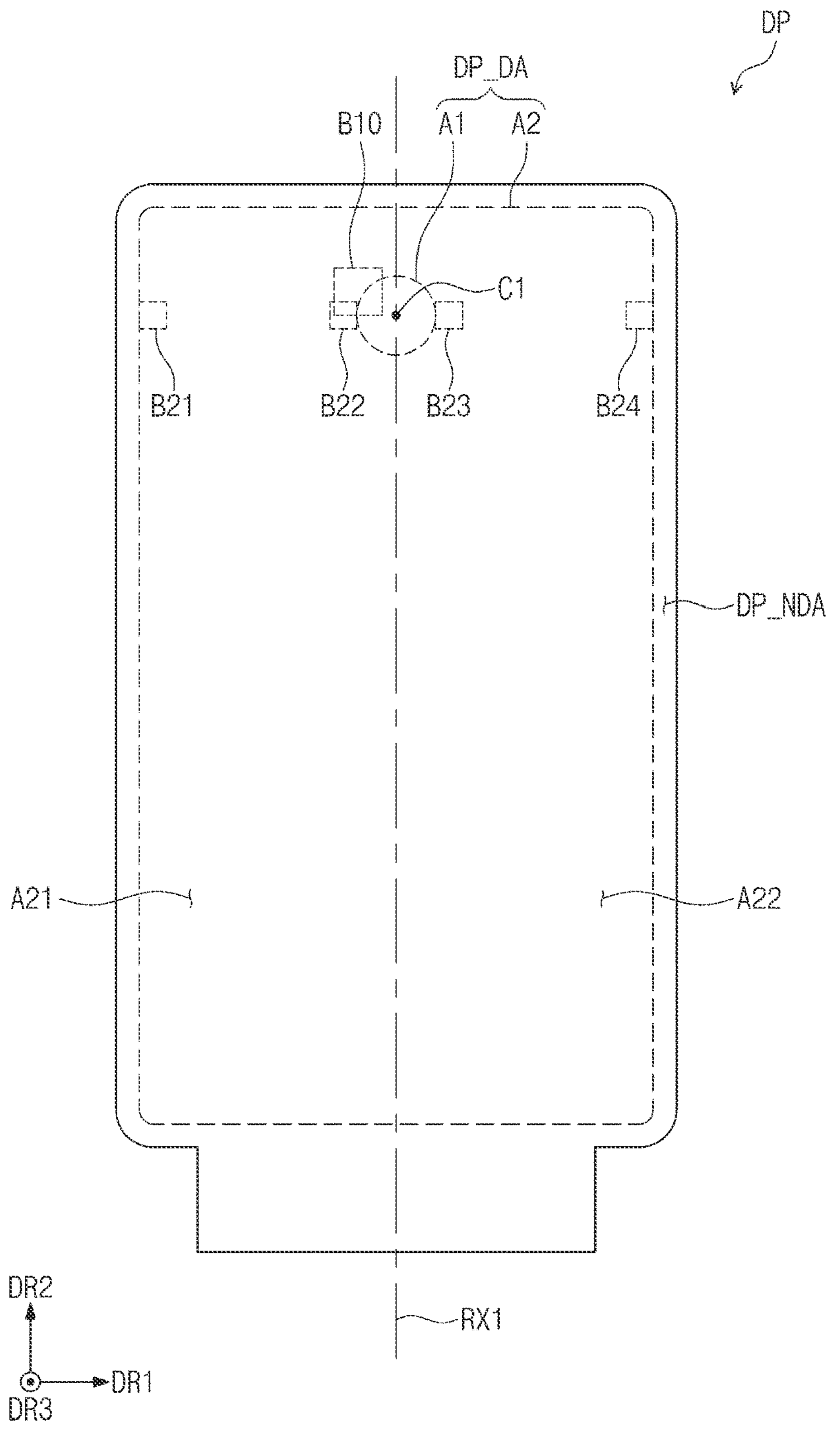
FIG. 6A and FIG. 6B are plan views of display panels according to embodiments of the present disclosure, respectively.
Figure 6B:
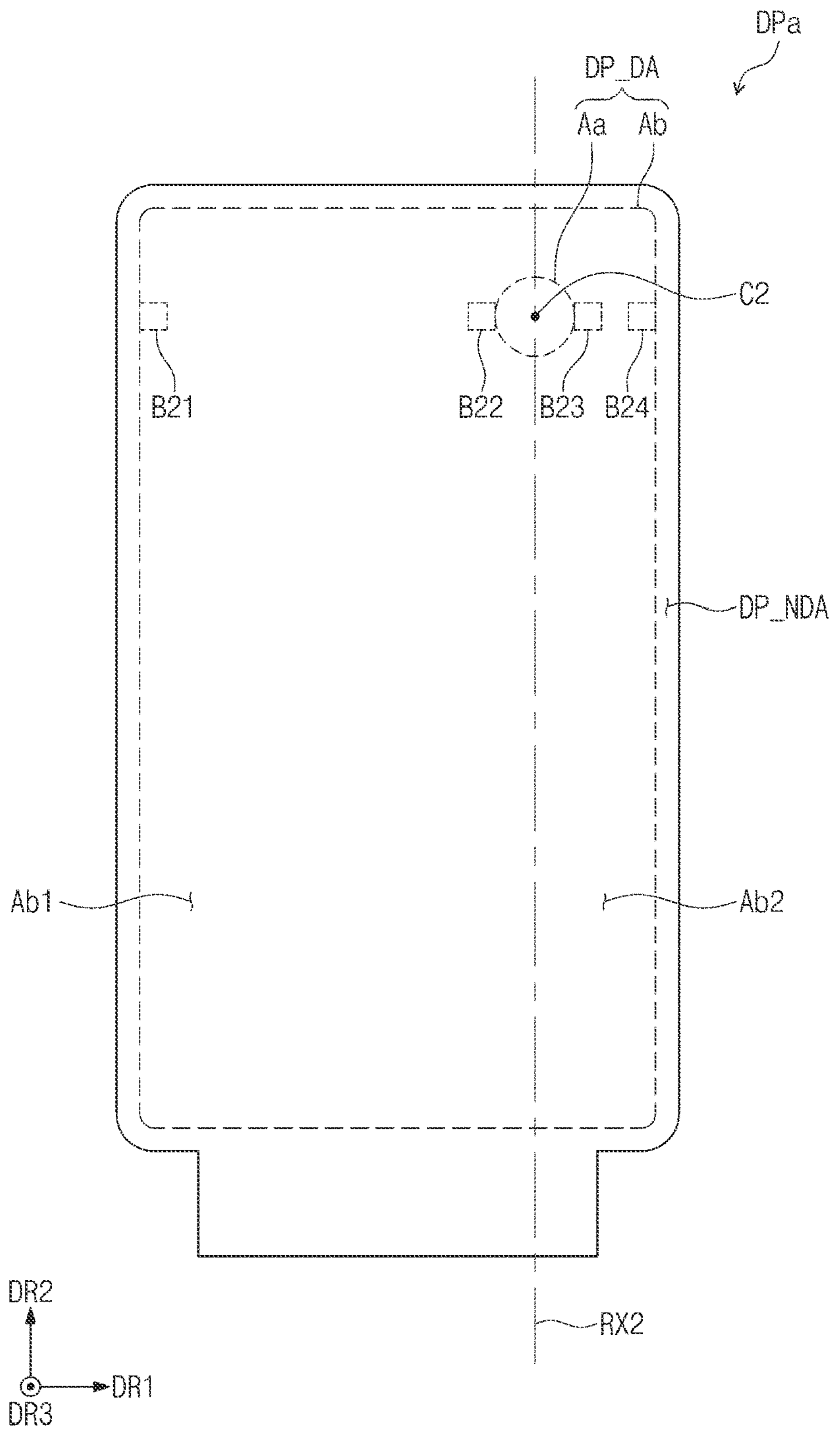

FIG. 6A and FIG. 6B are plan views of display panels according to embodiments of the present disclosure, respectively.

Referring to FIG. 6A, the display panel DP may include the display area DP_DA and the non-display area DP_NDA.

The display area DP_DA may include the first area A1 and the second area A2. The first area A1 may have a circular shape. However, the present disclosure is not limited thereto, and the first area A1 may have various shapes such as a polygon, an ellipse, a figure having at least one curved side, or an irregular shape. In one example of the present disclosure, the first area A1 may be located in a center of an upper side of the display area. However, the position of the first area A1 is not limited thereto. In a display panel DPa as shown in FIG. 6B, a first area Aa may be located adjacent to one (e.g., a right corner) of both opposing corners of an upper side of the display area DP_DA.

The first area A1 shows a shape surrounded with the second area A2. However, the present disclosure is not limited thereto. For example, the first area A1 may be partially surrounded with the second area A2, and one side of the first area A1 may be in contact with the non-display area DP_NDA.

In one example of the present disclosure, the second area A2 may be divided into a first side area A21 and a second side area A22 around a central axis RX1 passing through a center C1 of the first area A1 and parallel to the second direction DR2. When the center C1 of the first area A1 is located on a bisector that bisects the display area DP_DA in the second direction DR2, area sizes of the first side area A21 and the second side area A22 may be the same as each other. In one example of the present disclosure, a shape of the first side area A21 and a shape of the second side area A22 may be symmetrical with each other with respect to the central axis RX1.

Referring to FIG. 6B, the display panel DPa may include the display area DP_DA and the non-display area DP_NDA.

As shown in FIG. 6B, when a center C2 of the first area Aa is not located on the bisector that bisects the display area DP_DA in the second direction DR2, a second area Ab may be divided into a first side area Ab1 and a second side area Ab2 having different area sizes. In one example of the present disclosure, a shape of the first side area Ab1 and a shape of the second side area Ab2 may be asymmetrical with each other with respect to a central axis RX2 passing through the center C2 of the first area Aa and parallel to the second direction DR2.

Figure 7:
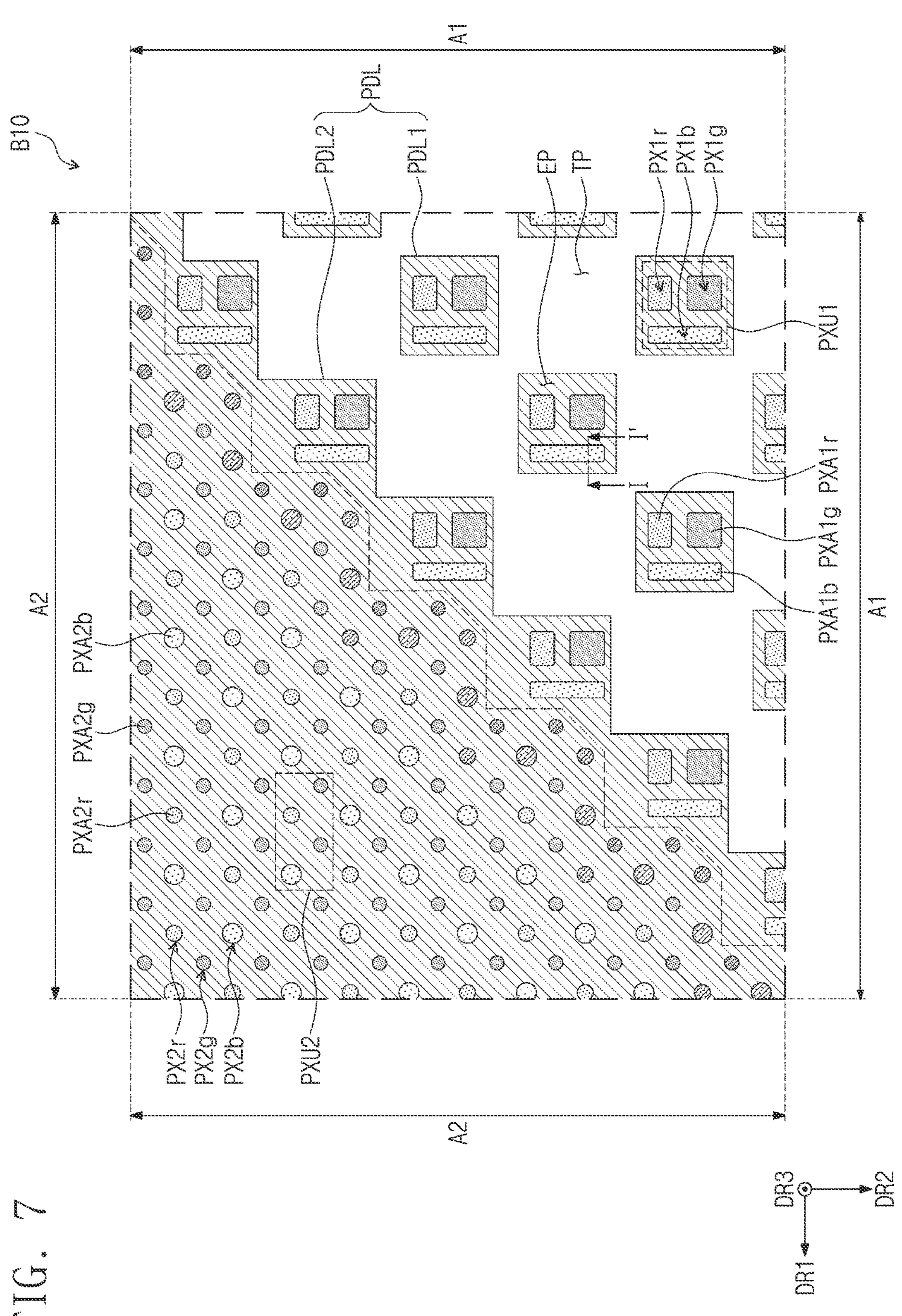
FIG. 7 is an enlarged plan view illustrating a partial area of a display panel according to an embodiment of the present disclosure.

FIG. 7 is an enlarged plan view illustrating a partial area B10 of a display panel according to an embodiment of the present disclosure.

Referring to FIG. 7, the display panel DP may include the first area A1 and the second area A2.

A plurality of pixels PX may be provided, and the plurality of pixels PX may include first pixels PX1*r*, PX1*g*, and PX1*b* and second pixels PX2*r*, PX2*g*, and PX2*b*. The first pixels PX1*r*, PX1*g*, and PX1*b* may be arranged in the first area A1. The second pixels PX2*r*, PX2*g*, and PX2*b* may be arranged in the second area A2.

The number of the first pixels PX1*r*, PX1*g*, and PX1*b* arranged in a reference area size of the first area A1 may be smaller than the number of the second pixels PX2*r*, PX2*g* and PX2*b* arranged in a reference area size of the second area A2. Therefore, a resolution of the first area A1 may be lower than that of the second area A2.

The first pixels PX1*r*, PX1*g*, and PX1*b* may include a first red pixel PX1*r*, a first green pixel PX1*g*, and a first blue pixel PX1*b*. The second pixels PX2*r*, PX2*g*, and PX2*b* may include a second red pixel PX2*r*, a second green pixel PX2*g*, and a second blue pixel PX2*b*. A planar shape of each of the first pixels PX1*r*, PX1*g*, and PX1*b* and the second pixels PX2*r*, PX2*g*, and PX2*b* shown in FIG. 7 may correspond to a shape of the light-emitting area defined in the light-emitting element. The light-emitting area may be an area defined by a pixel defining opening defined in a pixel defining film PDL.

FIG. 7 shows first light-emitting areas PXA1*r*, PXA1*g*, and PXA1*b* respectively corresponding to the first pixels PX1*r*, PX1*g*, and PX1*b* and second light-emitting areas PXA2*r*, PXA2*g*, and PXA2*b* respectively corresponding to the second pixels PX2*r*, PX2*g*, and PX2*b*. The first light-emitting areas PXA1*r*, PXA1*g*, and PXA1*b* may include a first red light-emitting area PXA1*r*, a first green light-emitting area PXA1*g*, and a first blue light-emitting area PXA1*b*. The second light-emitting areas PXA2*r*, PXA2*g*, and PXA2*b* may include a second red light-emitting area PXA2*r*, a second green light-emitting area PXA2*g*, and a second blue light-emitting area PXA2*b*.

In one example of the present disclosure, an area size of the first red light-emitting area PXA1*r* may be larger than an area size of the second red light-emitting area PXA2*r*, an area size of the first green light-emitting area PXA1*g* may be larger than an area size of the second green light-emitting area PXA2*g*, and an area size of the first blue light-emitting area PXA1*b* may be larger than an area size of the second blue light-emitting area PXA2*b*. When implementing the same luminance in the reference area size, a size of each of the first pixels PX1*r*, PX1*g*, and PX1*b* which should emit relatively brighter light may be larger than a size of each of the second pixels PX2*r*, PX2*g*, and PX2*b*, thereby compensating for a lifetime of each of the first pixels PX1*r*, PX1*g*, and PX1*b*.

FIG. 7 shows the pixel defining film PDL. The pixel defining film PDL may include sub-defining patterns PDL1 and a main defining layer PDL2.

The sub-defining patterns PDL1 may be disposed in the first area A1 and may be arranged so as to be spaced apart from each other. For example, the first area A1 may include the transmissive area TP and element areas EP. The sub-defining patterns PDL1 may not overlap with the transmissive area TP, and may overlap with the element areas EP.

A plurality of first pixel units PXU1 may be disposed in the first area A1, and each of the first pixel units PXU1 may include the first pixels PX1*r*, PX1*g*, and PX1*b*. Areas of the first area A1 in which the first pixel units PXU1 are arranged may be defined as the element areas EP. The sub-defining patterns PDL1 may positionally correspond to the first pixel units PXU1. First pixel defining openings PDL_OP1 (see FIG. 9A) corresponding to the first light-emitting areas PXA1*r*, PXA1*g*, and PXA1*b* may be defined in each of the sub-defining patterns PDL1.

The main defining layer PDL2 may cover the second area A2 and a portion of the first area A1. A plurality of second pixel units PXU2 may be disposed in the second area A2, and each of the second pixel units PXU2 may include the second pixels PX2*r*, PX2*g*, and PX2*b*. The main defining layer PDL2 may have second pixel defining openings PDL_OP2 (see FIG. 9B) defined therein corresponding to the second light-emitting areas PXA2*r*, PXA2*g*, and PXA2*b*.

Figure 8A:
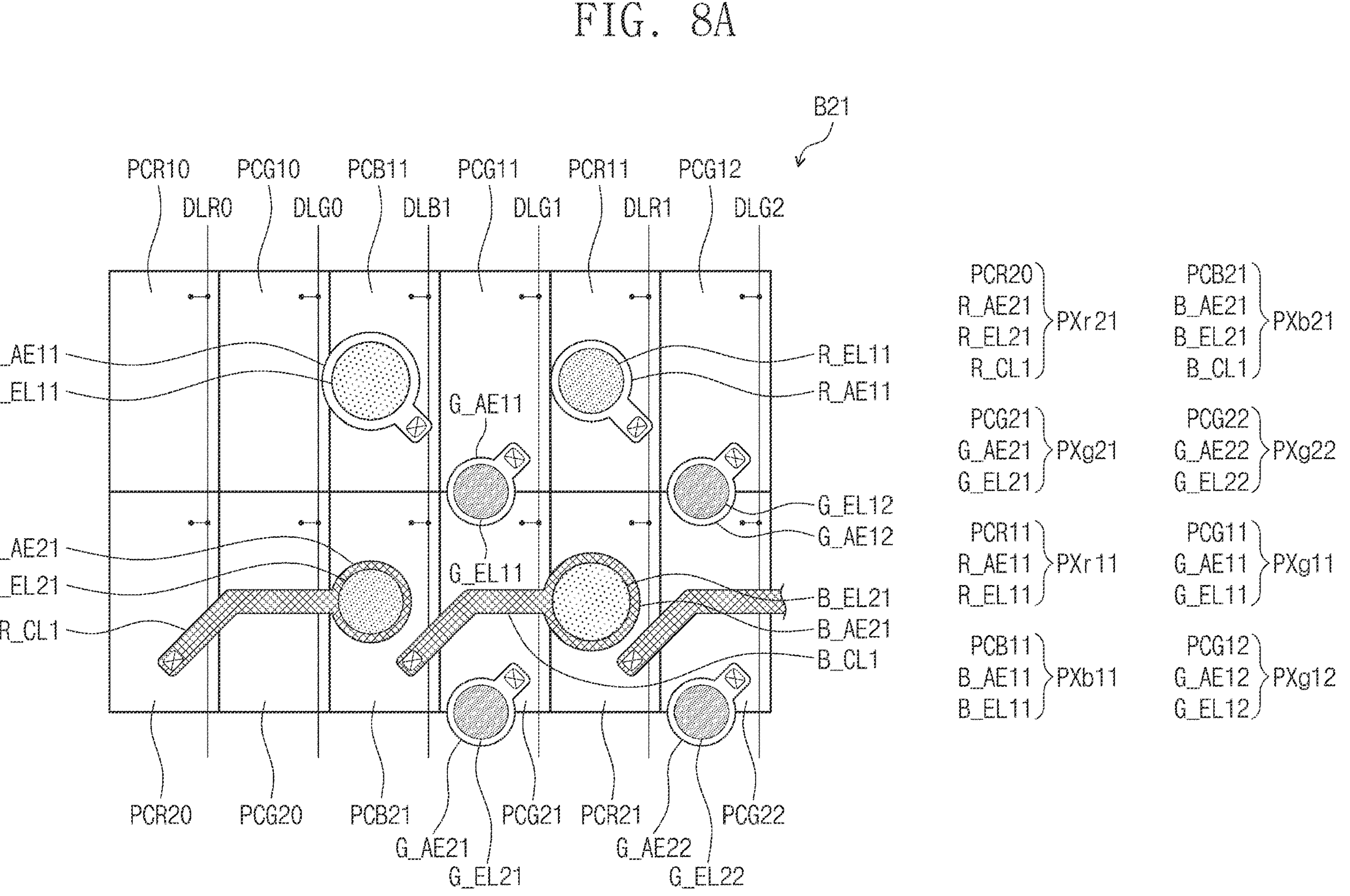
FIG. 8A is an enlarged view showing a pixel arrangement of a first portion shown in each of FIG. 6A and FIG. 6B.
Figure 8B:
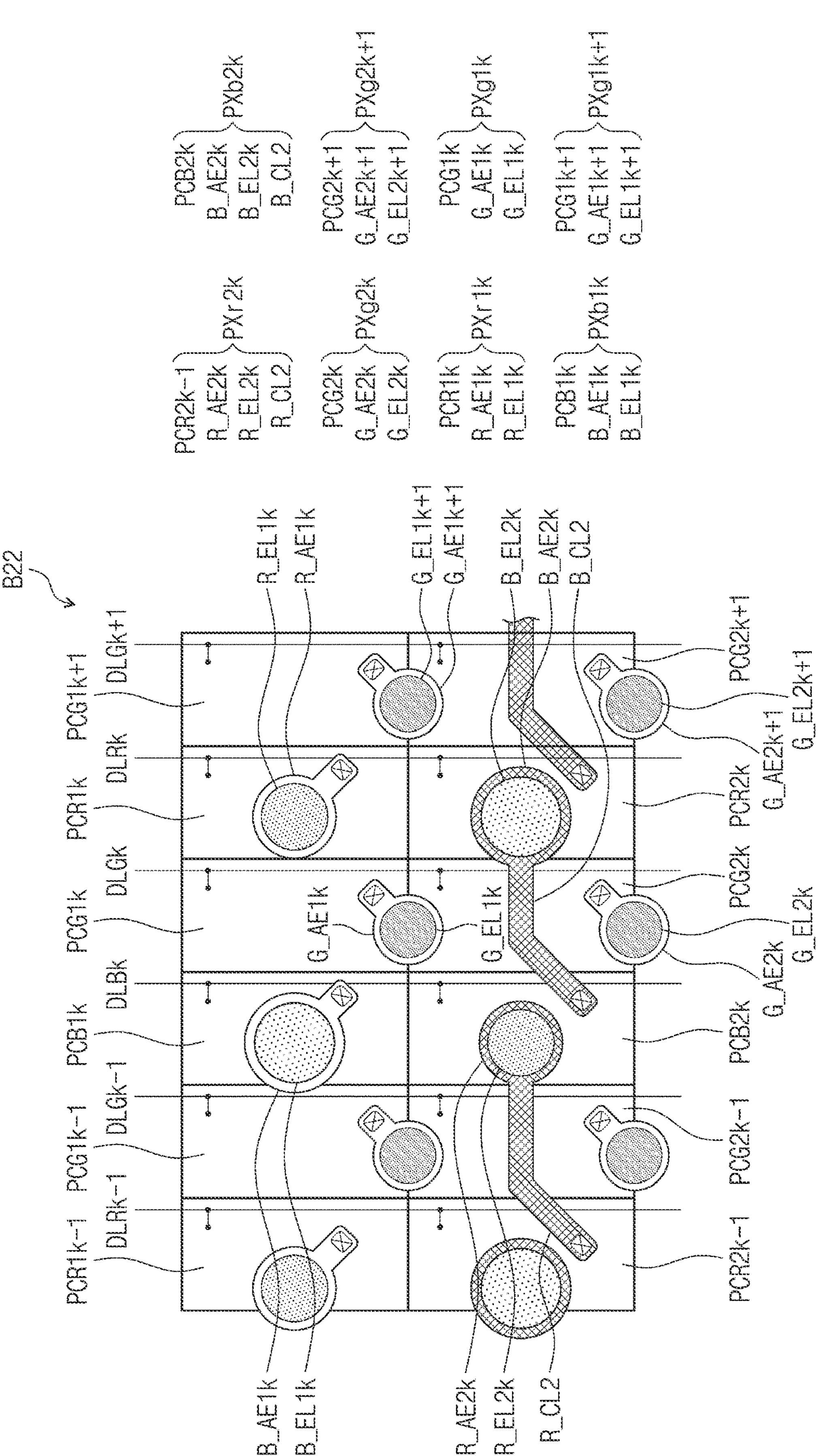
FIG. 8B is an enlarged view showing a pixel arrangement of a second portion shown in each of FIGS. 6A and 6B.
Figure 8D:
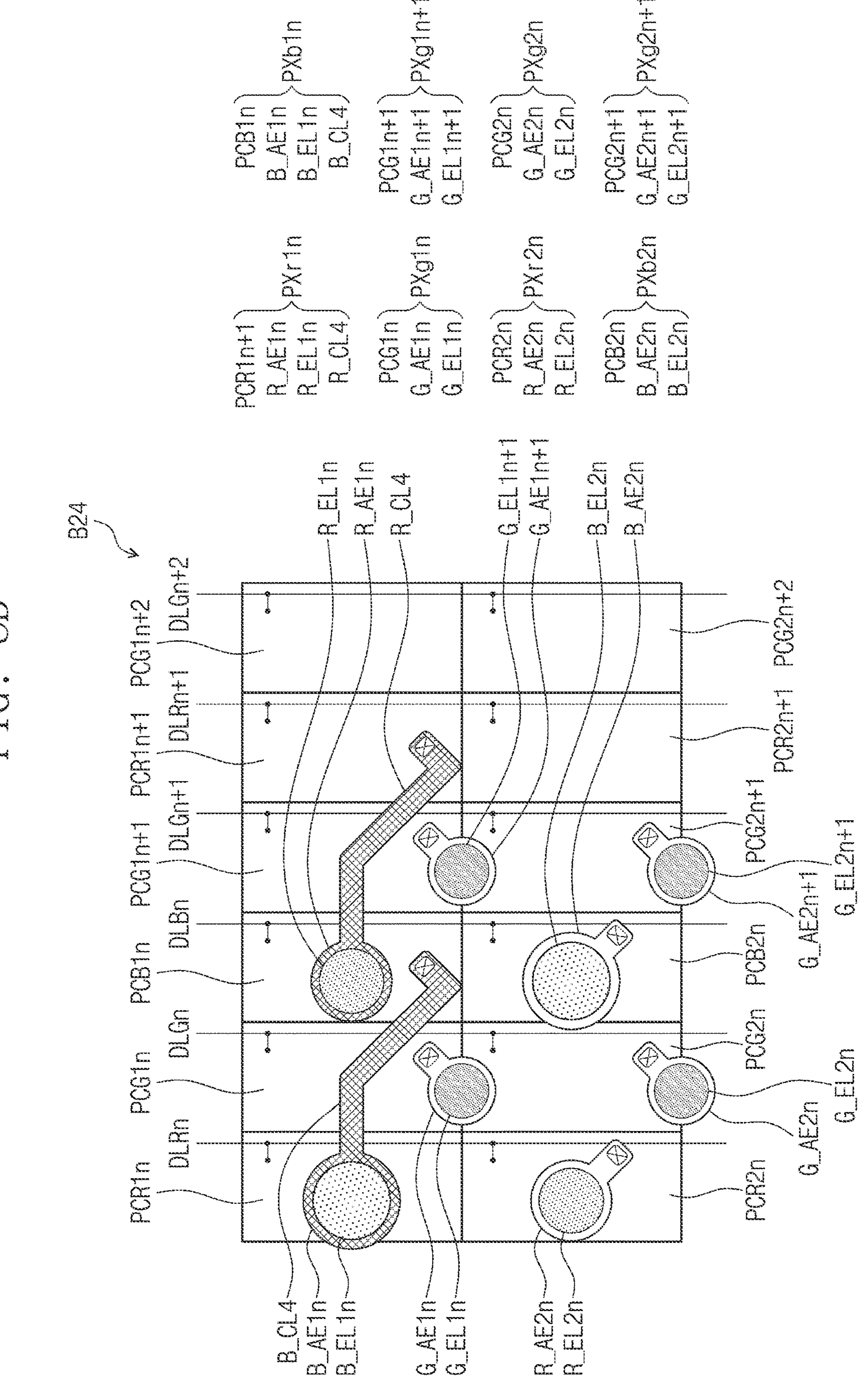
FIG. 8D is an enlarged view showing a pixel arrangement of a fourth portion shown in each of FIGS. 6A and 6B.

FIG. 8A is an enlarged view showing a pixel arrangement of a first portion B21 shown in each of FIG. 6A and FIG. 6B. FIG. 8B is an enlarged view showing a pixel arrangement of a second portion B22 shown in each of FIG. 6A and FIG. 6B. FIG. 8C is an enlarged view showing a pixel arrangement of a third portion B23 shown in each of FIG. 6A and FIG. 6B. FIG. 8D is an enlarged view showing a pixel arrangement of a fourth portion B24 shown in each of FIG. 6A and FIG. 6B.

The first and second portions B21 and B22 respectively shown in FIG. 8A and FIG. 8B may be located in each of the first side areas A21 or Ab1 shown in each of FIG. 6A and FIG. 6B. The third and fourth portions B23 and B24 respectively shown in FIGS. 8C and 8D may be located in each of the second side areas A22 or Ab2 shown in FIGS. 6A and 6B.

Referring to FIG. 8A, data lines DLR0, DLG0, DLB1, DLG1, DLR1, and DLG2 are disposed in the first portion B21 located in the first side area A21 or Ab1. In the first portion B21, pixels (hereinafter, first-row pixels) disposed in a first row (e.g., an odd-numbered row) and pixels (hereinafter, second-row pixels) disposed in a second row (e.g., an even-numbered row) are disposed. The first-row pixels may include a first-row red pixel PXr11, a first-row blue pixel PXb11, and a first-row green pixel PXg11 or PXg12. The second-row pixels may include a second-row red pixel PXr21, a second-row blue pixel PXb21, and a second-row green pixel PXg21 or PXg22.

The first-row red pixel PXr11 includes a first-row red pixel circuit PCR11 connected to a data line DLR1 and a first-row red light-emitting element. The first-row red light-emitting element may include a first-row red anode electrode R_AE11 connected to the first-row red pixel circuit PCR11, and a first-row red light-emitting layer R_EL11 disposed on the first-row red anode electrode R_AE11. The first-row blue pixel PXb11 includes a first-row blue pixel circuit PCB11 connected to a data line DLB1 and a first-row blue light-emitting element. The first-row blue light-emitting element may include a first-row blue anode electrode B_AE11 connected to the first-row blue pixel circuit PCB11 and a first-row blue light-emitting layer B_EL11 disposed on the first-row blue anode electrode B_AE11. The first-row green pixel PXg11 or PXg12 includes a first-row green pixel circuit PCG11 or PCG12 connected to a data line DLG1 or DLG2 and a first-row green light-emitting element. The first-row green light-emitting element may include a first-row green anode electrode G_AE11 or G_AE12 connected to the first-row green pixel circuit PCG11 or PCG12, and a first-row green light-emitting layer G_EL11 or G_EL12 disposed on the first-row green anode electrode G_AE11 or G_AE12. In this regard, the first-row red pixel circuit PCR11, the first-row blue pixel circuit PCB11 and the first-row green pixel circuit PCG11 or PCG12 may be referred to as a first side pixel circuit.

The second-row red pixel PXr21 includes a second-row red pixel circuit PCR20 (referred to as an additional or dummy pixel circuit) connected to a data line DLR0 (referred to as an additional data line or a dummy data line), and a second-row red light-emitting element connected to the second-row red pixel circuit PCR20 via a first red connection wiring R_CL1. The second-row red light-emitting element may include a second-row red anode electrode R_AE21 connected to the second-row red pixel circuit PCR20, and a second-row red light-emitting layer R_EL21 disposed on the second-row red anode electrode R_AE21. The first red connection wiring R_CL1 connects the second-row red pixel circuit PCR20 and the second-row red anode electrode R_AE21 to each other. The first red connection wiring R_CL1 may overlap at least one data line in a plan view. In one example of the present disclosure, the first red connection wiring R_CL1 may overlap the two data lines DLR0 and DLG0 in a plan view.

As used herein, the terms “additional pixel circuit,” “dummy pixel circuit,” “additional data line,” and “dummy data line” are pixel circuits or data lines that in operation do not provide a data signal to a light-emitting element regardless of whether a light-emitting element is connected to the additional or dummy pixel circuit or the additional or dummy data line.

The second-row blue pixel PXb21 includes a second-row blue pixel circuit PCB21 connected to a data line DLB1 and a second-row blue light-emitting element connected to the second-row blue pixel circuit PCB21 via a first blue connection wiring B_CL1. The second-row blue light-emitting element may include a second-row blue anode electrode B_AE21 connected to the second-row blue pixel circuit PCB21, and a second-row blue light-emitting layer B_EL21 disposed on the second-row blue anode electrode B_AE21. The first blue connection wiring B_CL1 connects the second-row blue pixel circuit PCB21 and the second-row blue anode electrode B_AE21 to each other. The first blue connection wiring B_CL1 may overlap at least one data line in a plan view. In one example of the present disclosure, the first blue connection wiring B_CL1 may overlap the two data lines DLB1 and DLG1 in a plan view.

In one example of the present disclosure, the first red connection wiring R_CL1 is disposed on the same layer as a layer on which the second-row red anode electrode R_AE21 is disposed, and is integral with the second-row red anode electrode R_AE21. The first blue connection wiring B_CL1 is disposed on the same layer as a layer on which the second-row blue anode electrode B_AE21 is disposed and is integral with the second-row blue anode electrode B_AE21. However, the present disclosure is not limited thereto. Alternatively, the first red connection wiring R_CL1 is disposed on a different layer from a layer on which the second-row red anode electrode R_AE21 is disposed, and the first blue connection wiring B_CL1 is disposed on a different layer from a layer on which the second-row blue anode electrode B_AE21 is disposed.

The second-row green pixel PXg21 or PXg22 includes a second-row green pixel circuit PCG21 or PCG22 connected to a data line DLG1 or DLG2, and a second-row green light-emitting element. The second-row green light-emitting element may include a second-row green anode electrode G_AE21 or G_AE22 connected to the second-row green pixel circuit PCG21 or PCG22, and a second-row green light-emitting layer G_EL21 or G_EL22 disposed on the second-row green anode electrode G_AE21 or G_AE22.

Normal pixels (or first side normal pixels) may be arranged in a first-row of the first side area A21 or Ab1. In this regard, the normal pixel may refer to a pixel that does not include a connection wiring connecting an anode electrode and a pixel circuit to each other. In the first row of the first side area A21 or Ab1, non-normal pixels (or first side non-normal pixels) may not be disposed. In this regard, an non-normal pixel may refer to a pixel including a connection wiring connecting an anode electrode and a pixel circuit to each other. The normal pixels and the non-normal pixels may be arranged in the second row of the first side area A21 or Ab1. In the second row, the normal pixels may include the second-row green pixel PXg21 or PXg22, and the non-normal pixels may include the second-row red pixel PXr21 and the second-row blue pixel PXb21.

The first-row pixels may further include two dummy pixel circuits PCR10 and PCG10, and the second-row pixels may further include two dummy pixel circuits PCR20 and PCG20. One of the two dummy pixel circuits PCR20 and PCG20 arranged in the second row may be included in the second-row red pixel PXr21. The dummy pixel circuits PCR10, PCG10, PCR20, and PCG20 may be connected to the dummy data lines DLR0 and DLG0. A spacing between the central axis RX1 and the dummy data lines DLR0 and DLG0 is larger than a spacing between the central axis RX1 and the other data lines DLB1, DLG1, DLR1, and DLG2.

In this regard, the data lines DLR0 and DLR1 is red data lines to which red data signals for operating the red pixels PXr11 and PXr21 are applied. The data lines DLG0, DLG1, and DLG2 are green data lines to which green data signals for operating the green pixels PXg11, PXg12, PXg21, and PXg22 are applied. The data line DLB1 is a blue data line to which blue data signals for operating the blue pixels PXb11 and PXb21 are applied. In this way, when each of the data lines receives only data signals corresponding to one color, power consumed in the data driver may be reduced. That is, power consumption may be reduced compared to a case where a red data signal and a blue data signal are alternately applied to one data line.

The data lines DLR0 and DLG0 are dummy data lines additionally disposed in the first side area A21 or Ab1. In one example of the present disclosure, it is shown that a red data line DLR0 and a green data line DLG0 are added as dummy data lines. However, the present disclosure is not limited thereto. For example, when non-normal pixels (i.e., PXr21 and PXb22) are disposed in the second-row pixels, the red data line DLR0 and the green data line DLG0 may be added as dummy data lines. Alternatively, when non-normal pixels are disposed in the first-row pixels, the red data line DLR0 may be replaced with a blue data line.

Referring to FIG. 8B, in the second portion B22 located in the first side area A21 or Ab1, data lines DLRk−1, DLGk−1, DLBk, DLGk, DLRk, and DLGk+1 (or the first side data lines) are disposed. In the second portion B22, the first-row pixels arranged in the first row (e.g., an odd-numbered row) and the second-row pixels arranged in the second row (e.g., an even-numbered row) are disposed. The first-row pixels include a first-row red pixel PXr1*k*, a first-row blue pixel PXb1*k*, and a first-row green pixel PXg1*k* or PXg1*k*+1. The second-row pixels include a second-row red pixel PXr2*k*, a second-row blue pixel PXb2*k*, and a second-row green pixel PXg2*k* or PXg2*k*+1.

The first-row red pixel PXr1*k* includes a first-row red pixel circuit PCR1*k* connected to the data line DLRk and a first-row red light-emitting element. The first-row red light-emitting element may include a first-row red anode electrode R_AE1*k* connected to the first-row red pixel circuit PCR1*k*, and a first-row red light-emitting layer R_EL1*k* disposed on the first-row red anode electrode R_AE1*k*. The first-row blue pixel PXb1*k* includes a first-row blue pixel circuit PCB1*k* connected to the data line DLBk and a first-row blue light-emitting element. The first-row blue light-emitting element may include a first-row blue anode electrode B_AE1*k* connected to the first-row blue pixel circuit PCB1*k*, and a first-row blue light-emitting layer B_EL1*k* disposed on the first-row blue anode electrode B_AE1*k*. The first-row green pixel PXg1*k* or PXg1*k*+1 includes a first-row green pixel circuit PCG1*k* or PCG1*k*+1 to the data line DLGk or DLGk+1 and a first-row green light-emitting element. The first-row green light-emitting element may include a first-row green anode electrode G_AE1*k* or G_AE1*k*+1 connected to the first-row green pixel circuit PCG1*k* or PCG1*k*+1 and a first-row green light-emitting layer G_EL1*k* or G_EL1*k*+1 disposed on the first-row green anode electrode G_AE1*k* or G_AE1*k*+1.

The second-row red pixel PXr2*k* includes a second-row red pixel circuit PCR2*k*-1 (referred to as an additional pixel circuit or an adjacent pixel circuit) connected to the data line DLRk−1 (referred to as an additional data line or an adjacent data line) and a second-row red light-emitting element connected to the second-row red pixel circuit PCR2*k*−1 via a second red connection wiring R_CL2. The second-row red light-emitting element may include a second-row red anode electrode R_AE2*k* connected to the second-row red pixel circuit PCR2*k*−1, and a second-row red light-emitting layer R_EL2*k* disposed on the second-row red anode electrode R_AE2*k*. The second red connection wiring R_CL2 connects the second-row red pixel circuit PCR2*k*−1 and the second-row red anode electrode R_AE2*k* to each other. The second red connection wiring R_CL2 may overlap at least one data line in a plan view. In one example of the present disclosure, the second red connection wiring R_CL2 may overlap two data lines DLRk−1 and DLGk−1 in a plan view.

The second-row blue pixel PXb2*k* includes a second-row blue pixel circuit PCB2*k* connected to the data line DLBk, and a second-row blue light-emitting element connected to the second-row blue pixel circuit PCB2*k* via a second blue connection wiring B_CL2. The second-row blue light-emitting element may include a second-row blue anode electrode B_AE2*k* connected to the second-row blue pixel circuit PCB2*k*, and a second-row blue light-emitting layer B_EL2*k* disposed on the second-row blue anode electrode B_AE2*k*. The second blue connection wiring B_CL2 connects the second-row blue pixel circuit PCB2*k* and the second-row blue anode electrode B_AE2*k* to each other. The second blue connection wiring B_CL2 may overlap at least one data line in a plan view. In one example of the present disclosure, the second blue connection wiring B_CL2 may overlap two data lines DLBk and DLGk in a plan view.

In one example of the present disclosure, the second red connection wiring R_CL2 is disposed on the same layer as a layer on which the second-row red anode electrode R_AE2*k* is disposed, and is integral with the second-row red anode electrode R_AE2*k*. The second blue connection wiring B_CL2 is disposed on the same layer as a layer on which the second-row blue anode electrode B_AE2*k* is disposed and is integral with the second-row blue anode electrode B_AE2*k*. However, the present disclosure is not limited thereto. Alternatively, the second red connection wiring R_CL2 is disposed on a different layer from a layer on which the second-row red anode electrode R_AE2*k* is disposed, and the second blue connection wiring B_CL2 is disposed on a different layer from a layer on which the second-row blue anode electrode B_AE2*k* is disposed.

The second-row green pixel PXg2*k* or PXg2*k*+1 includes a second-row green pixel circuit PCG2*k* or PCG2*k*+1 connected to the data line DLGk or DLGk+1, and a second-row green light-emitting element. The second-row green light-emitting element may include a second-row green anode electrode G_AE2*k* or G_AE2*k*+1 connected to the second-row green pixel circuit PCG2*k* or PCG2*k*+1 and a second-row green light-emitting layer G_EL2*k* or G_EL2*k*+1 disposed on the second-row green anode electrode G_AE2*k* or G_AE2*k*+1.

Normal pixels may be arranged in the first row of the first side area A21 or Ab1. In this regard, the normal pixels may refer to pixels that do not include a connection wiring connecting an anode electrode and a pixel circuit to each other. Non-normal pixels may not be arranged in the first row of the first side area A21 or Ab1. In this regard, the non-normal pixels may refer to pixels including a connection wiring connecting an anode electrode and a pixel circuit to each other. The normal pixels and the non-normal pixels may be arranged in the second row of the first side area A21 or Ab1. In the second-row, the normal pixels may include the second-row green pixel PXg2*k* or PXg2*k*+1, and the non-normal pixels may include the second-row red pixel PXr2*k* and the second-row blue pixel PXb2*k*.

Each of the connection wirings R_CL1, B_CL1, R_CL2, and B_CL2 disposed in the first side area A21 or Ab1 may extend from a corresponding anode electrode in a first extension direction away from the central axis RX1 or RX2. In one example of the present disclosure, the first extension direction may be parallel to the first direction DR1. The dummy or additional data lines DLR0, DLG0, DLRk−1, and DLGk−1 and the dummy or additional pixel circuits PCR10, PCG10, PCR20, PCG20, PCR1*k*−1, PCG1*k*−1, PCR2*k*−1, and PCG2*k*−1 may be disposed adjacent to a first side of the first side area A21 or Ab1 adjacent to the non-display area DP_NDA (see FIG. 6A and FIG. 6B). Therefore, the dummy or additional pixel circuits PCR10, PCG10, PCR20, PCG20, PCR1k−1, PCG1k−1, PCR2k−1, and PCG2k−1 may not be disposed at a boundary between the first area A1 or Aa and the second area A2 or Ab. As a result, a problem that a pixel layout becomes complicated due to the dummy or additional pixel circuits PCR10, PCG10, PCR20, PCG20, PCR1k−1, PCG1k−1, PCR2k−1, and PCG2k−1 may be minimized.

Referring to FIG. 8C, in the third portion B23 located in the second side area A22 or Ab2, data lines DLRj, DLGj, DLBj, DLGj+1, DLRj+1, and DLGj+2 (or second side data lines) are disposed. In the third portion B23, pixels (hereinafter, the first-row pixels) disposed in the first row (e.g., an odd-numbered row) and pixels (hereinafter, the second-row pixels) disposed in the second row (e.g., an even-numbered row) are disposed. The first-row pixels include a first-row red pixel PXr1j, a first-row blue pixel PXb1j, and a first-row green pixel PXg1j or PXg1j+1. The second-row pixels include a second-row red pixel PXr2j, a second-row blue pixel PXb2j, and a second-row green pixel PXg2j or PXg2j+1.

The first-row red pixel PXr1j includes a first-row red pixel circuit PCR1j+1 (referred to as an additional pixel circuit or an adjacent pixel circuit) connected to a data line DLRj+1 (referred to as an additional data line or an adjacent data line), and a first-row red light-emitting element connected to the first-row red pixel circuit PCR1j+1 via a third red connection wiring R_CL3. The first-row red light-emitting element may include a first-row red anode electrode R_AE1j connected to the first-row red pixel circuit PCR1j+1, and a first-row red light-emitting layer R_EL1j disposed on the first-row red anode electrode R_AE1j. The third red connection wiring R_CL3 connects the first-row red pixel circuit PCR1j+1 and the first-row red anode electrode R_AE1j to each other. The third red connection wiring R_CL3 may overlap at least one data line in a plan view. In one example of the present disclosure, the third red connection wiring R_CL3 may overlap two data lines DLBj and DLGj+1 in a plan view.

The first-row blue pixel PXb1j includes a first-row blue pixel circuit PCB1j connected to the data line DLBj, and a first-row blue light-emitting element connected to the first-row blue pixel circuit PCB1j via a third blue connection wiring B_CL3. The first-row blue light-emitting element may include a first-row blue anode electrode B_AE1j connected to the first-row blue pixel circuit PCB1j, and a first-row blue light-emitting layer B_EL1j disposed on the first-row blue anode electrode B_AE1j. The third blue connection wiring B_CL3 connects the first-row blue pixel circuit PCB1j and the first-row blue anode electrode B_AE1j to each other. The third blue connection wiring B_CL3 may overlap at least one data line in a plan view. In one example of the present disclosure, the third blue connection wiring B_CL3 may overlap two data lines DLRj and DLGj in a plan view.

In one example of the present disclosure, the third red connection wiring R_CL3 is disposed on the same layer as a layer on which the first-row red anode electrode R_AE1j is disposed, and is integral with the first-row red anode electrode R_AE1j. The third blue connection wiring B_CL3 is disposed on the same layer as a layer on which the first-row blue anode electrode B_AE1j is disposed, and is integral with the first-row blue anode electrode B_AE1j. However, the present disclosure is not limited thereto. Alternatively, the third red connection wiring R_CL3 is disposed on a different layer from a layer on which the first-row red anode electrode R_AE1j is disposed, and the third blue connection wiring B_CL3 is disposed on a different layer from a layer on which the first-row blue anode electrode B_AE1j is disposed.

The first-row green pixel PXg1j or PXg1j+1 includes a first-row green pixel circuit PCG1j or PCG1j+1 connected to the data line DLGj or DLGj+1 and a first-row green light-emitting element. The first-row green light-emitting element may include a first-row green anode electrode G_AE1j or G_AE1j+1 connected to the first-row green pixel circuit PCG1j or PCG1j+1, and a first-row green light-emitting layer G_EL1j or G_EL1j+1 disposed on the first-row green anode electrode G_AE1j or G_AE1j+1.

The second-row red pixel PXr2j includes a second-row red pixel circuit PCR2j connected to the data line DLRj and a second-row red light-emitting element. The second-row red light-emitting element may include a second-row red anode electrode R_AE2j connected to the second-row red pixel circuit PCR2j, and a second-row red light-emitting layer R_EL2j disposed on the second-row red anode electrode R_AE2j.

The second-row blue pixel PXb2j includes a second-row blue pixel circuit PCB2j connected to the data line DLBj and a second-row blue light-emitting element. The second-row blue light-emitting element may include a second-row blue anode electrode B_AE2j connected to the second-row blue pixel circuit PCB2j, and a row blue light-emitting layer B_EL2j disposed on the second-row blue anode electrode B_AE2j.

The second-row green pixel PXg2j or PXg2j+1 includes a second-row green pixel circuit PCG2j or PCG2j+1 connected to the data line DLGj or DLGj+1 and a second-row green light-emitting element. The second-row green light-emitting element may include a second-row green anode electrode G_AE2j or G_AE2j+1 connected to the second-row green pixel circuit PCG2j or PCG2j+1, and a second-row green light-emitting layer G_EL2j or G_EL2j+1 disposed on the second-row green anode electrode G_AE2j or G_AE2j+1.

Referring to FIG. 8D, in the fourth portion B24 located in the second side area A22 or Ab2, data lines DLRn, DLGn, DLBn, DLGn+1, DLRn+1, and DLGn+2 (or second side data lines) are disposed. In the fourth portion B24, the first-row pixels are disposed in the first row (e.g., an odd-numbered row) and the second-row pixels are disposed in the second row (e.g., an even-numbered row). The first-row pixels include a first-row red pixel PXr1n, a first-row blue pixel PXb1n, and a first-row green pixel PXg1n or PXg1n+1. The second-row pixels include a second-row red pixel PXr2n, a second-row blue pixel PXb2n, and a second-row green pixel PXg2n or PXg2n+1.

The first-row red pixel PXr1n includes a first-row red pixel circuit PCR1n+1 (referred to as an additional or dummy pixel circuit) connected to the data line DLRn+1 (referred to as an additional or dummy data line), and a first-row red light-emitting element connected to the first-row red pixel circuit PCR1n+1 via a fourth red connection wiring R_CL4. The first-row red light-emitting element may include a first-row red anode electrode R_AE1n connected to the first-row red pixel circuit PCR1n+1, and a first-row red light-emitting layer R_EL1n disposed on the first-row red anode electrode R_AE1n. The fourth red connection wiring R_CL4 connects the first-row red pixel circuit PCR1n+1 and the first-row red anode electrode R_AE1n to each other. The fourth red connection wiring R_CL4 may overlap at least one data line in a plan view. In one example of the present disclosure, the fourth red connection wiring R_CL4 may overlap two data lines DLBn and DLGn+1 in a plan view. However, the fourth red connection wiring R_CL4 may not overlap with the data lines DLRn+1 and DLGn+2 (referred to as additional data lines or dummy data lines) in a plan view.

The first-row blue pixel PXb1*n* includes a first-row blue pixel circuit PCB1*n* connected to the data line DLBn and a first-row blue light-emitting element connected to the first-row blue pixel circuit PCB In via a fourth blue connection wiring B_CL4. The first-row blue light-emitting element may include a first-row blue anode electrode B_AE1*n* connected to the first-row blue pixel circuit PCB1*n*, and a first-row blue light-emitting layer B_EL1*n* disposed on the first-row blue anode electrode B_AE1*n*. The fourth blue connection wiring B_CL4 connects the first-row blue pixel circuit PCB1*n* and the first-row blue anode electrode B_AE1*n* to each other. The fourth blue connection wiring B_CL4 may overlap at least one data line in a plan view. In one example of the present disclosure, the fourth blue connection wiring B_CL4 may overlap two data lines DLRn and DLGn in a plan view.

In one example of the present disclosure, the fourth red connection wiring R_CL4 is disposed on the same layer as a layer on which the first-row red anode electrode R_AE1*n* is disposed, and is integral with the first-row red anode electrode R_AE1*n*. The fourth blue connection wiring B_CL4 is disposed on the same layer as a layer on which the first-row blue anode electrode B_AE1*n* is disposed and is integral with the first-row blue anode electrode B_AE1*n*. However, the present disclosure is not limited thereto. Alternatively, the fourth red connection wiring R_CL4 is disposed on a different layer from a layer on which the first-row red anode electrode R_AE1*n* is disposed, and the fourth blue connection wiring B_CL4 is disposed on a different layer from a layer on which the first-row blue anode electrode B_AE1*n* is disposed.

The first-row green pixel PXg1*n* or PXg1*n*+1 includes a first-row green pixel circuit PCG1*n* or PCG1*n*+1 connected to the data line DLGn or DLGn+1 and a first-row green light-emitting element. The first-row green light-emitting element may include a first-row green anode electrode G_AE1*n* or G_AE1*n*+1 connected to the first-row green pixel circuit PCG1*n* or PCG1*n*+1, and a first-row green light-emitting layer G_EL1*n* or G_EL1*n*+1 disposed on the first-row green anode electrode G_AE1*n* or G_AE1*n*+1.

The second-row red pixel PXr2*n* includes a second-row red pixel circuit PCR2*n* connected to the data line DLRn and a second-row red light-emitting element. The second-row red light-emitting element may include a second-row red anode electrode R_AE2*n* connected to the second-row red pixel circuit PCR2*n*, and a second-row red light-emitting layer R_EL2*n* disposed on the second-row red anode electrode R_AE2*n*.

The second-row blue pixel PXb2*n* includes a second-row blue pixel circuit PCB2*n* connected to the data line DLBn and a second-row blue light-emitting element. The second-row blue light-emitting element may include a second-row blue anode electrode B_AE2*n* connected to the second-row blue pixel circuit PCB2*n*, and a second-row blue light-emitting layer B_EL2*n* disposed on the second-row blue anode electrode B_AE2*n*.

The second-row green pixel PXg2*n* or PXg2*n*+1 includes a second-row green pixel circuit PCG2*n* or PCG2*n*+1 connected to the data line DLGn or DLGn+1 and a second-row green light-emitting element. The second-row green light-emitting element may include a second-row green anode electrode G_AE2*n* or G_AE2*n*+1 connected to the second-row green pixel circuit PCG2*n* or PCG2*n*+1 and a second-row green light-emitting layer G_EL2*n* or G_EL2*n*+1 disposed on the second-row green anode electrode G_AE2*n* or G_AE2*n*+1.

The normal pixels (or the second side normal pixels) and the non-normal pixels (or the second side normal pixels) may be disposed in the first-row of the second side area A22 or Ab2. In this regard, the normal pixels may refer to pixels that do not include a connection wiring connecting an anode electrode to a pixel circuit. The non-normal pixels may refer to pixels including the connection wiring connecting the anode electrode to the pixel circuit. In the first row, the normal pixels may include the first-row green pixels PXg1*j*, PXg1*j*+1, PXg1*n*, and PXg1*n*+1, and the non-normal pixels may include the first-row red pixels PXr1*j* and PXr1*n* and the first-row blue pixels PXb1*j* and PXb1*n*. The non-normal pixels may not be arranged in the second row of the second side area A22 or Ab2. That is, a row (e.g., the second row (i.e., the even-numbered row)) in the first side area A21 or Ab1 where the non-normal pixels are disposed and a row (e.g., the first row (i.e., the odd-numbered row)) in the second side area A22 or Ab2 where the non-normal pixels are disposed may be different from each other. However, the present disclosure is not limited thereto. Alternatively, a row (e.g., the second row (i.e., the even-numbered row)) in the first side area A21 or Ab1 where the non-normal pixels are disposed and a row (e.g., the second row (i.e., the even-numbered row)) in the second side area A22 or Ab2 where the non-normal pixels are disposed may be identical to each other.

The first-row pixels may further include two dummy pixel circuits PCR1*n*+1 and PCG1*n*+2, and the second-row pixels may further include two dummy pixel circuits PCR2*n*+1 and PCG2*n*+2. One of the two dummy pixel circuits PCR1*n*+1 and PCG1*n*+2 arranged in the first-row may be included in the first-row red pixel PXr1*n*. The dummy pixel circuits PCR1*n*+1, PCG1*n*+2, PCR2*n*+1, and PCG2*n*+2 may be connected to the data lines DLRn+1 and DLGn+2. A spacing between the central axis RX1 and the dummy data lines DLRn+1 and DLGn+2 is larger than a spacing between the central axis RX1 and the other data lines DLRn, DLGn, DLBn, and DLGn+1

In this regard, the data lines DLRn and DLRn+1 are red data lines to which red data signals for operating the red pixels PXr1*n* and PXr2*n* are applied. The data lines DLGn, DLGn+1, and DLGn+2 are green data lines to which green data signals for operating the green pixels PXg1*n*, PXg1*n*+1, PXg2*n*, and PXg2*n*+1 are applied. The data line DLBn is a blue data line to which blue data signals for operating the blue pixels PXb1*n* and PXb2*n* are applied. In this way, when each of the data lines receives only data signals corresponding to one color, power consumed in the data driver may be reduced. That is, power consumption may be reduced compared to a case where a red data signal and a blue data signal are alternately applied to one data line.

The data lines DLRn+1 and DLGn+2 are dummy data lines additionally arranged in the second side area A22 or Ab2. In one example of the present disclosure, it is shown that the red data line DLRn+1 and the green data line DLGn+2 are added as dummy data lines. However, the present disclosure is not limited thereto. For example, when the non-normal pixels (i.e., PXr1*n* and PXb1*n*) are disposed in the first-row pixels, the red data line DLRn+1 and the green data line DLGn+2 may be added as dummy data lines. Alternatively, when the non-normal pixels are disposed in the second-row pixels, the red data line DLRn+1 may be replaced with a blue data line.

Each of the connection wirings R_CL3, B_CL3, R_CL4, and B_CL4 disposed in the second side area A22 or Ab2 may extend from a corresponding anode electrode in a second extension direction away from the central axis RX1 or RX2. The second extension direction may be opposite to the first extension direction. In one example of the present disclosure, the first and second extension directions may be parallel to the first direction DR1. The dummy or additional data lines DLRj+1, DLGj+2, DLRn+1, and DLGn+2 and the dummy or additional pixel circuits PCR1*j*+1, PCG1*j*+2, PCR2*j*+1, PCG2*j*+2, PCR1*n*+1, PCG1*n*+2, PCR2*n*+1, and PCG2*n*+2 may be disposed adjacent to a second side of the second side area A22 or Ab2 adjacent to the non-display area DP_NDA (see FIG. 6A and FIG. 6B). Therefore, the dummy or additional pixel circuits may not be disposed at the boundary between the first area A1 or Aa and the second area A2 or Ab. As a result, a problem that a pixel layout becomes complicated due to the dummy or additional pixel circuits may be minimized.

Figure 9A:
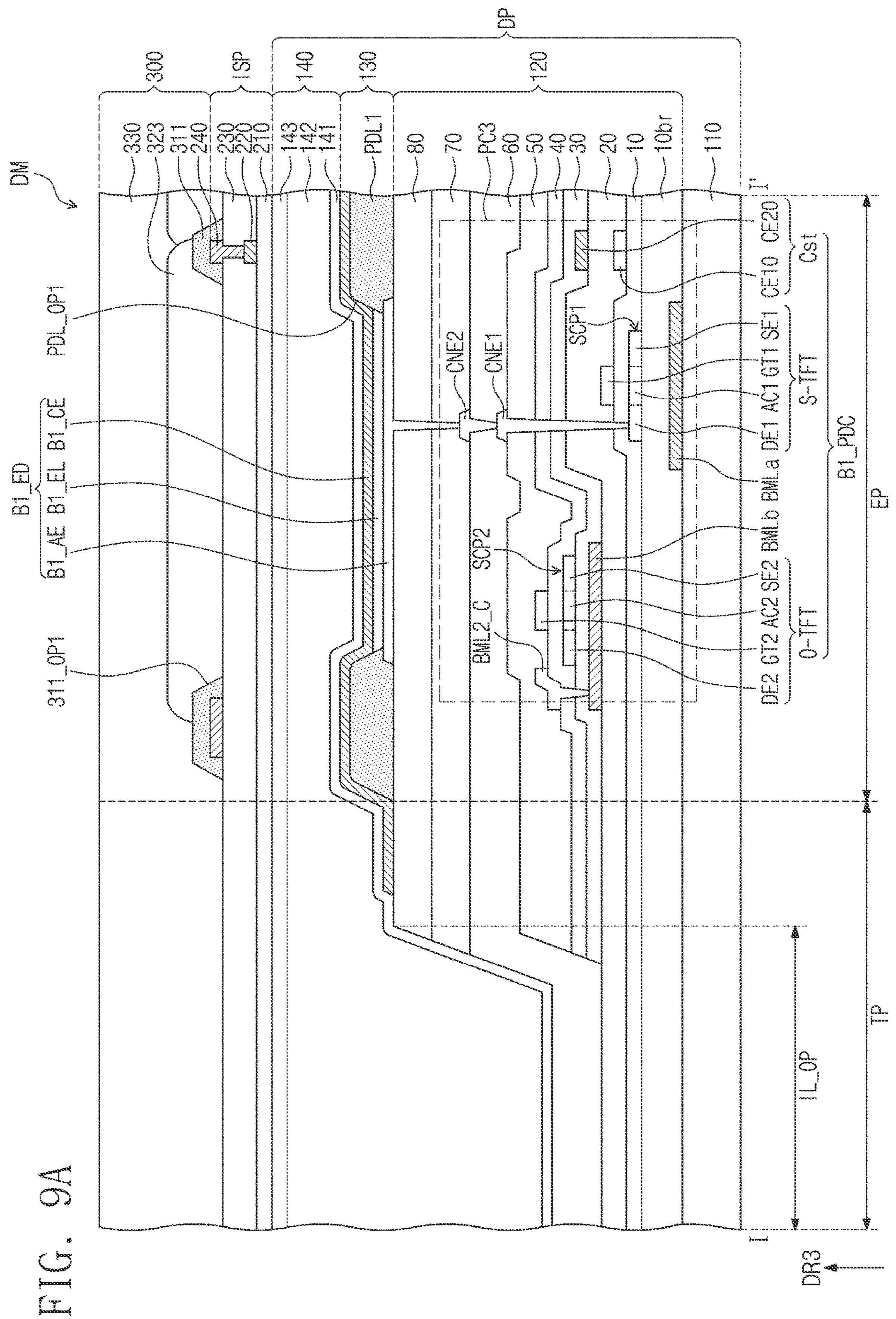
FIG. 9A is a cross-sectional view of a display module cut along a cutting line I-I' shown in FIG. 7.
Figure 9B:
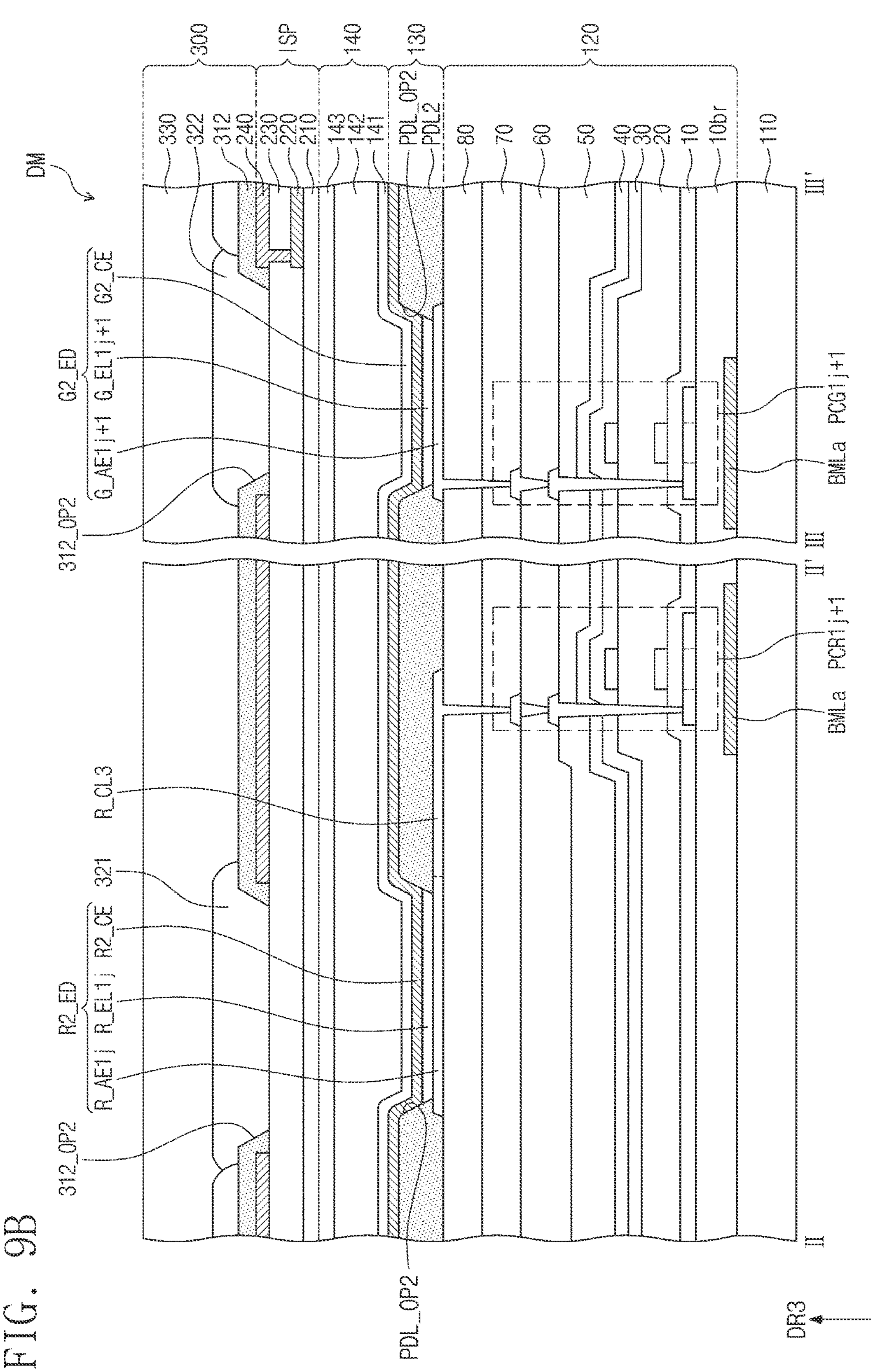
FIG. 9B is a cross-sectional view of a display module cut along cutting lines II-II' and III-III' shown in FIG. 8C.

FIG. 9A is a cross-sectional view of a display module cut along a cutting line I-I' shown in FIG. 7, and FIG. 9B is a cross-sectional view of a display module cut along cutting lines II-II' and III-III' shown in FIG. 8C.

Referring to FIG. 7 and FIG. 9A, a first blue light-emitting element B1_ED and a portion of the first blue pixel circuit B1_PDC included in the first blue pixel PX1*b* among the first pixels PX1*r*, PX1*g*, and PX1*b* disposed in the first area A1 are shown. However, a structure of each of the first red pixel PX1*r* and the first green pixel PX1*g* which are not shown in FIG. 9A is substantially the same as that of the first blue pixel PX1*b*. Thus, a description of the structure of the first blue pixel PX1*b* may be equally applied to the structure of each of the first red pixel PX1*r* and the first green pixel PX1*g*.

In one example of the present disclosure, the first blue pixel circuit B1_PDC may include a silicon transistor S-TFT and an oxide transistor O-TFT. The silicon transistor S-TFT may correspond to the sixth transistor T6 in FIG. 5, and the oxide transistor O-TFT may correspond to the third or fourth transistor T3 or T4 in FIG. 5.

A buffer layer 10*br* may be disposed on the base layer 110. The buffer layer 10*br* may prevent diffusion of metal atoms or impurities from the base layer 110 into a first semiconductor pattern SCP1 disposed above the buffer layer. The first semiconductor pattern SCP1 includes an active area AC1 of the silicon transistor S-TFT. The buffer layer 10*br* may adjust a heat supply rate during a crystallization process for forming the first semiconductor pattern SCP1 so that the first semiconductor pattern SCP1 is uniformly formed.

A first black metal layer BMLa may be disposed under the silicon transistor S-TFT, and a second black metal layer BMLb may be disposed under the oxide transistor O-TFT. The first and second black metal layers BMLa and BMLb may overlap with other components of the first blue pixel circuit B1_PDC. The first and second black metal layers BMLa and BMLb may prevent external light from reaching the first blue pixel circuit B1_PDC.

The first black metal layer BMLa may be disposed between the base layer 110 and the buffer layer 10*br*. In an embodiment of the present disclosure, an inorganic barrier layer may be further disposed between the first black metal layer BMLa and the buffer layer 10*br*. The first black metal layer BMLa may be connected to an electrode or a wiring, and may receive a constant voltage or signal therefrom. According to an embodiment of the present disclosure, the first black metal layer BMLa may be embodied as a floating electrode which is isolated from another electrode or wiring.

The second black metal layer BMLb may be disposed in a corresponding manner to and under the oxide transistor O-TFT. The second black metal layer BMLb may be disposed between a second insulating layer 20 and a third insulating layer 30. The second black metal layer BMLb may be disposed in the same layer as a layer in which a second electrode CE20 of the capacitor Cst is disposed. The second black metal layer BMLb may be connected to a contact electrode BML2_C and may receive a constant voltage or signal therefrom. The contact electrode BML2_C may be disposed in the same layer as a layer in which a gate electrode GT2 of the oxide transistor O-TFT is disposed.

Each of the first black metal layer BMLa and the second black metal layer BMLb may include a reflective metal. For example, each of the first black metal layer BMLa and the second black metal layer BMLb may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), or p+ doped amorphous silicon. The first black metal layer BMLa and the second black metal layer BMLb may include the same material or different materials.

Although not separately shown, according to an embodiment of the present disclosure, the second black metal layer BMLb may be omitted. The first black metal layer BMLa may extend to a position under the oxide transistor O-TFT so that the first black metal layer BMLa may prevent light from being incident on a bottom of the oxide transistor O-TFT.

The first semiconductor pattern SCP1 may be disposed on the buffer layer 10*br*. The first semiconductor pattern SCP1 may include silicon semiconductor. For example, the silicon semiconductor may include amorphous silicon, polycrystalline silicon, or the like. For example, the first semiconductor pattern SCP1 may include low-temperature polysilicon.

The first semiconductor pattern SCP1 may have electrical properties varying depending on whether it is doped or not. The first semiconductor pattern SCP1 may include a conductive area with high conductivity and a channel area with low conductivity. The conductive area may be doped with N-type dopants or P-type dopants. A P-type transistor may include a doped area doped with a P-type dopant, and an N-type transistor may include a doped area doped with an N-type dopant. The channel area may be a non-doped area or an area doped with a dopant at a lower concentration than a dopant concentration of the conductive area.

The conductivity of the conductive area may be greater than that of the channel area, and the conductive area may actually serve as an electrode or a signal line. The channel area may substantially act as the active area of the transistor. In other words, a portion of the first semiconductor pattern SCP1 may be an active area of a transistor, another portion may be a source or a drain of the transistor, and still another portion thereof may be a connection electrode or a connection signal line.

A source area SE1 (or a source), a channel area AC1 (or a channel), and a drain area DE1 (or a drain) of the silicon transistor S-TFT may be formed from the first semiconductor pattern SCP1. The source area SE1 and the drain area DE1 may extend in opposite directions from the channel area AC1 in a cross-sectional view.

A first insulating layer 10 may be disposed on the buffer layer 10*br*. The first insulating layer 10 may commonly overlap a plurality of pixels and may cover the first semiconductor pattern SCP1. The first insulating layer 10 may be an inorganic layer or an organic layer, and may have a single-layer or multi-layer structure. The first insulating layer 10 may include at least one of aluminum oxide, titanium oxide, silicon oxide, silicon nitride, silicon oxynitride, zirconium oxide, or hafnium oxide. In this embodiment, the first insulating layer 10 may be a silicon oxide layer having a single-layer structure. The first insulating layer 10 as well as an insulating layer of the circuit layer 120 to be described later may be an inorganic layer or an organic layer, and may have a single-layer or multi-layer structure. The inorganic layer may include at least one of the above materials. However, the present disclosure is not limited thereto.

A gate electrode GT1 of the silicon transistor S-TFT is disposed on the first insulating layer 10. The gate electrode GT1 may be a portion of a metal pattern. The gate electrode GT1 overlaps the channel area AC1. In a process of doping the first semiconductor pattern SCP1 with dopants, the gate electrode GT1 may function as a mask. The gate electrode GT1 may include titanium (Ti), silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), indium tin oxide (ITO), indium zinc oxide (IZO), or the like. However, the present disclosure is not particularly limited thereto.

The second insulating layer 20 may be disposed on the first insulating layer 10 and may cover the gate electrode GT1. The third insulating layer 30 may be disposed on the second insulating layer 20. The second electrode CE20 of the capacitor Cst may be disposed between the second insulating layer 20 and the third insulating layer 30. Further, a first electrode CE10 of the capacitor Cst may be disposed between the first insulating layer 10 and the second insulating layer 20.

A second semiconductor pattern SCP2 may be disposed on the third insulating layer 30. The second semiconductor pattern SCP2 may include a channel area AC2 of the oxide transistor O-TFT as described later. The second semiconductor pattern SCP2 may include oxide semiconductor. The second semiconductor pattern SCP2 may include a transparent conductive oxide (TCO) such as indium tin oxide (ITO,) indium zinc oxide (IZO), indium gallium zinc oxide (IGZO), zinc oxide (ZnO) or indium oxide ($In_2O_3$).

The oxide semiconductor may include a plurality of areas distinguished from each other based on whether the transparent conductive oxide is reduced or not. An area (hereinafter, a reduced area) where the transparent conductive oxide is reduced has higher conductivity than an area (hereinafter, a non-reduced area) where the transparent conductive oxide is not reduced. The reduced area actually plays the role of a source/drain of the transistor or a signal line. The non-reduced area substantially corresponds to a semiconductor area (or an active area or a channel) of the transistor. In other words, a portion of the second semiconductor pattern SCP2 may be a semiconductor area of a transistor, another portion thereof may be a source area/drain area of the transistor, and still another portion thereof may be a signal transfer area.

A source area SE2 (or a source), a channel area AC2 (or a channel), and a drain area DE2 (or a drain) of the oxide transistor O-TFT may be formed from the second semiconductor pattern SCP2. The source area SE2 and the drain area DE2 may extend in opposite directions from the channel area AC2 in a cross-sectional view.

A fourth insulating layer 40 may be disposed on the third insulating layer 30. As shown in FIG. 9A, the fourth insulating layer 40 may overlap a gate electrode GT2 of the oxide transistor O-TFT and cover the second semiconductor pattern SCP2.

The gate electrode GT2 of the oxide transistor O-TFT is disposed on the fourth insulating layer 40. The gate electrode GT2 of the oxide transistor O-TFT may be a portion of a metal pattern. The gate electrode GT2 of the oxide transistor O-TFT overlaps the active area AC2.

A fifth insulating layer 50 may be disposed on the fourth insulating layer 40 and may cover the gate electrode GT2 and the contact electrode BML2_C. A first connection electrode CNE1 may be disposed on the fifth insulating layer 50. The first connection electrode CNE1 may be connected to the drain area DE1 of the silicon transistor S-TFT via a contact-hole extending through the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 via a contact-hole extending through the sixth insulating layer 60. A seventh insulating layer 70 may be disposed on the sixth insulating layer 60 and may at least partially cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include a general-purpose polymer such as BCB (Benzocyclobutene), polyimide, HMDSO (Hexamethyldisiloxane), PMMA (Polymethylmethacrylate), or polystyrene (PS), polymer derivatives having phenolic groups, acrylate-based polymers, imide-based polymers, arylether-based polymers, amide-based polymers, fluorine-based polymers, p-xylene-based polymers, vinyl alcohol-based polymers, or blends thereof.

The light-emitting element layer 130 including the first blue light-emitting element B1_ED may be disposed on the circuit layer 120. The first blue light-emitting element B1_ED may include a first electrode B1_AE (or an anode electrode), a light-emitting layer B1_EL, and a second electrode B1_CE (or a cathode electrode). A second electrode of each of the first red light-emitting element and the first green light-emitting element included in the first red pixel PX1*r* and the first green pixel PX1*g* respectively may be integral with the second electrode B1_CE of the first blue light-emitting element B1_ED. That is, the second electrode B1_CE may commonly belong to the first red light-emitting element and the first green light-emitting element.

The first electrode B1_AE of the first blue light-emitting element B1_ED may be disposed on the eighth insulating layer 80. The first electrode B1_AE of the first blue light-emitting element B1_ED may be a (semi)transmissive electrode or a reflective electrode. According to an embodiment of the present disclosure, the first electrode B1_AE of the first blue light-emitting element B1_ED may include a reflective layer made of Ag, Mg, Al, Pt, Pd, Au, Ni, Nd, Ir, Cr or a compound thereof or the like and a transparent or translucent electrode layer formed on the reflective layer. The transparent or translucent electrode layer may include at least one selected from a group consisting of indium tin oxide (ITO), indium zinc oxide (IZO), indium gallium zinc oxide (IGZO), zinc oxide (ZnO) or indium oxide ($In_2O_3$), and aluminum doped zinc oxide (AZO). For example, the first electrode B1_AE of the first blue light-emitting element B1_ED may include a stacked structure of ITO/Ag/ITO.

Referring to FIG. 7 and FIG. 9A, the pixel defining film PDL may be disposed on the eighth insulating layer 80. The pixel defining film PDL may have a property of absorbing light, and for example, the pixel defining film PDL may have a black color. The pixel defining film PDL may include a black coloring agent. The black coloring agent may include black dyes and black pigments. The black coloring agent may include metals such as carbon black and chromium, or oxides thereof. The pixel defining film PDL may act as a light-shielding pattern having light-shielding properties.

The pixel defining film PDL may include the sub-defining patterns PDL1 disposed in the first area A1 and the main defining layer PDL2 disposed in the second area A2. The sub-defining pattern PDL1 may be disposed in the element area EP of the first area A1 and may be absent in the transmissive area TP thereof.

The sub-defining pattern PDL1 may partially cover the first electrode B1_AE of the first blue light-emitting element B1_ED. For example, a first pixel defining opening PDL_OP1 exposing a portion of the first electrode B1_AE of the first blue light-emitting element B1_ED may be defined in the sub-defining pattern PDL1. The light-emitting layer B1_EL is disposed on the first electrode B1_AE exposed through the first pixel defining opening PDL_OP1, and the second electrode B1_CE is disposed on the light-emitting layer B1_EL.

An insulating opening IL_OP may be defined in at least some of the plurality of insulating layers 10, 20, 30, 40, 50, 60, 70, and 80 included in the circuit layer 120. In one example of the present disclosure, the insulating opening IL_OP may be defined in the second to fifth insulating layers 20, 30, 40, and 50 and the seventh and eighth insulating layers 70 and 80. The insulating opening IL_OP may be defined in an area overlapping the transmissive area TP. That is, a portion of each of the second to fifth insulating layers 20, 30, 40, and 50 and the seventh and eighth insulating layers 70 and 80 overlapping the transmissive area TP may be removed such that transmittance of the transmissive area TP may be improved.

The encapsulation layer 140 may be disposed on the light-emitting element layer 130. The encapsulation layer 140 may include an inorganic layer 141, an organic layer 142, and an inorganic layer 143 sequentially stacked. However, the layers constituting the encapsulation layer 140 are not limited thereto.

The inorganic layers 141 and 143 may protect the light-emitting element layer 130 from moisture and oxygen, and the organic layer 142 may protect the light-emitting element layer 130 from foreign substances such as dust particles. Each of the inorganic layers 141 and 143 may include a silicon nitride layer, a silicon oxynitride layer, a silicon oxide layer, a titanium oxide layer, or an aluminum oxide layer. The organic layer 142 may include an acrylic organic layer. However, the present disclosure is not limited thereto.

Referring to FIG. 8C and FIG. 9B, the oxide transistor O-TFT of each of the first-row red pixel circuit PCR1*j*+1 and the first-row green pixel circuit PCG1*j*+1 disposed in the second side area A22 or Ab2 (see FIG. 6A and FIG. 6B) is not shown. However, a structure of each of the second-row red pixel circuit PCR2*k* and the second-row green pixel circuit PCG2*k* disposed in the first side area A21 or Ab1 (see FIG. 6A and FIG. 6B) is similar to the structure of each of the first-row red pixel circuit PCR1*j*+1 and the first-row green pixel circuit PCG1*j*+1 as described with reference to FIG. 9B. Thus, a detailed description about the second-row blue pixel circuit PCB2*k* and the second-row green pixel circuit PCG2*k* will be omitted.

The first-row red pixel circuit PCR1*j*+1 is electrically connected to the first-row red light-emitting element R2_ED via the third red connection wiring R_CL3. The first-row red light-emitting element R2_ED may include a first electrode R_AE1*j*, (or an anode electrode), a light-emitting layer R_AE1*j*, and a second electrode R2_CE (or a cathode electrode). The third red connection wiring R_CL3 may be integral with the first electrode R_AE1*j*. That is, the first electrode R_AE1*j* and the third red connection wiring R_CL3 may be disposed on the eighth insulating layer 80 and may be simultaneously formed in the same process.

The first-row green pixel circuit PCG1*j*+1 is electrically connected to the first-row green light-emitting element G2_ED. The first-row green light-emitting element G2_ED may include a first electrode G_AE1*j* (or an anode electrode), a light-emitting layer G_EL1*j*, and a second electrode G2_CE (or a cathode electrode). The first-row green pixel circuit PCG1*j*+1 may directly contact the first electrode G_AE1*j*. The second electrode G2_CE of the first-row green light-emitting element G2_ED and the second electrode R2_CE of the first-row red light-emitting element R2_ED may be integral with each other.

Referring to FIG. 7 and FIG. 9B, the pixel defining film PDL may cover a portion of each of the first electrode R_AE1*j* of the first-row red light-emitting element R2_ED and the first electrode G_AE1*j*+1 of the first-row green light-emitting element G2_ED. For example, the pixel defining film PDL may have a second pixel defining opening PDL_OP2 defined therein exposing a portion of each of the first electrode R_AE1*j* of the first-row red light-emitting element R2_ED and the first electrode G_AE1*j*+1 of the first-row green light-emitting element G2_ED.

In one example of the present disclosure, the first pixel opening PDL_OP1 (see FIG. 9A) may have a larger size than that of the second pixel opening PDL_OP2.

Referring to FIG. 9A and FIG. 9B, the input sensor layer ISP may be disposed on the display panel DP. The input sensor layer ISP may include an insulating base layer 210, a first conductive layer 220, a sensing insulating layer 230, and a second conductive layer 240.

The insulating base layer 210 may be directly disposed on the display panel DP (e.g., the encapsulation layer 140). The insulating base layer 210 may be an inorganic layer including at least one of silicon nitride, silicon oxynitride, and silicon oxide. Alternatively, the insulating base layer 210 may be an organic layer including an epoxy resin, an acrylic resin, or an imide-based resin. The insulating base layer 210 may have a single-layer structure or a multi-layer structure in which layers are stacked along the third direction DR3.

Each of the first conductive layer 220 and the second conductive layer 240 may have a single-layer structure or a multi-layer structure in which layers are stacked along the third direction DR3. Each of the first and second conductive layers 220 and 240 having the single-layer structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). Alternatively, the transparent conductive layer may include a conductive polymer such as PEDOT, a metal nanowire, or graphene.

Each of the first and second conductive layers 220 and 240 having the multilayer structure may include a stack of metal layers. The stack of the metal layers may include, for example, a stack structure of a titanium layer/an aluminum layer/a titanium layer. Each of the first and second conductive layers 220 and 240 having the multilayer structure may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensing insulating layer 230 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin or perylene-based resin.

The anti-reflective layer 300 may be disposed on the input sensor layer ISP. The anti-reflective layer 300 may include a first partitioning layer 311, a second partitioning layer 312, a first color filter 321, a second color filter 322, a third color filter 323, and a planarization layer 330.

The first color filter 321, the second color filter 322, and the third color filter 323 may have different colors. Each of the first color filter 321, the second color filter 322, and the third color filter 323 may have one of red, green, and blue colors. The first color filter 321, the second color filter 322, and the third color filter 323 may be arranged in a predetermined form. For example, the first color filter 321, the second color filter 322, and the third color filter 323 may be arranged in consideration of colors of light beams emitted from the light-emitting elements included in the display panel DP. Further, the first color filter 321, the second color filter 322, and the third color filter 323 may have different sizes. When the light-emitting elements included in the display panel DP have different sizes, each of the first color filter 321, the second color filter 322, and the third color filter 323 may have a size corresponding to a size of a corresponding light-emitting element.

A material constituting each of the first and second partitioning layers 311 and 312 is not particularly limited as long as the material can absorb light. Each of the first and second partitioning layers 311 and 312 has a black color. In an embodiment, each of the first and second partitioning layers 311 and 312 may include a black coloring agent. The black coloring agent may include black dyes and black pigments. The black coloring agent may include a metal such as carbon black and chromium, or an oxide thereof.

The first and second partitioning layers 311 and 312 may cover the second conductive layer 240 of the input sensor layer ISP. The first and second partitioning layers 311 and 312 may prevent reflection of external light from the second conductive layer 240. The first partitioning layer 311 may overlap the element areas EP of the first area A1. That is, as the first partitioning layer 311 is not disposed in the transmissive area TP, the light transmittance of the first area A1 may be improved.

A first opening pattern 311_OP1 may be defined in the first partitioning layer 311. The first opening pattern 311_OP1 may overlap the first electrode B1_AE of the first blue light-emitting element B1_ED. The first opening pattern 311_OP1 may overlap one of the first color filter 321, the second color filter 322, and the third color filter 323. One of the first color filter 321, the second color filter 322, and the third color filter 323 may cover the first opening pattern 311_OP1. Each of the first color filter 321, the second color filter 322, and the third color filter 323 may overlap and contact the first partitioning layer 311 adjacent thereto.

A second opening pattern 312_OP2 may be defined in the second partitioning layer 312. The second opening pattern 312_OP2 may overlap the first electrode R_AE1*j* of the first-row red light-emitting element R2_ED and the first electrode G_AE1*j* of the first-row green light-emitting element G2_ED. The second opening pattern 312_OP2 may overlap one of the first color filter 321, the second color filter 322, and the third color filter 323. One of the first color filter 321, the second color filter 322, and the third color filter 323 may cover the second opening pattern 312_OP2. Each of the first color filter 321, the second color filter 322, and the third color filter 323 may overlap and contact the second partitioning layer 312 adjacent thereto.

The planarization layer 330 may cover the first and second partitioning layers 311 and 312 and the first to third color filters 321, 322 and 323. The planarization layer 330 may include an organic material, and an upper surface of the planarization layer 330 may be flat. In an embodiment of the present disclosure, the planarization layer 330 may be omitted.

According to the present disclosure, only a data signal corresponding to single color information may be supplied to each data line, such that total power consumption may be reduced, and complexity of the pixel layout around the sensing area may be reduced.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:

a display panel including a display area including a first area and a second area adjacent to the first area, wherein the second area is divided into a first side area and a second side area around a central axis passing through a center of the first area, wherein the display panel includes:

a first side data line disposed in the first side area;

a second side data line disposed in the second side area;

a first side pixel circuit electrically connected to the first side data line;

a second side pixel circuit electrically connected to the second side data line;

a first additional data line disposed in the first side area such that a spacing between the central axis and the first additional data line is larger than a spacing between the central axis and the first side data line;

a second additional data line disposed in the second side area such that a spacing between the central axis and the second additional data line is larger than a spacing between the central axis and the second side data line;

a first additional pixel circuit electrically connected to the first additional data line;

a second additional pixel circuit electrically connected to the second additional data line;

a first additional light-emitting element connected to the first additional pixel circuit via a first connection wiring; and a second additional light-emitting element connected to the second additional pixel circuit via a second connection wiring.

2. The display device of claim 1, wherein the first side data line includes first and second data lines, wherein the first side pixel circuit includes:

first and second pixel circuits disposed in a first row and connected to the first and second data lines, respectively; and third and fourth pixel circuits disposed in a second row and connected to the first and second data lines, respectively.

3. The display device of claim 2, wherein the display panel further includes first to fourth light-emitting elements respectively disposed on the first to fourth pixel circuits, wherein one of the first to fourth light-emitting elements is the first additional light-emitting element connected to the first additional pixel circuit via the first connection wiring.

4. The display device of claim 3, wherein each of the first to fourth light-emitting elements outputs one of red light, green light, and blue light.

5. The display device of claim 2, wherein the second side data line includes third and fourth data lines, wherein the second side pixel circuit includes:

fifth and sixth pixel circuits disposed in the first row and connected to the third and fourth data lines, respectively; and seventh and eighth pixel circuits disposed in the second row and connected to the third and fourth data lines, respectively.

6. The display device of claim 5, wherein the display panel further includes fifth to eighth light-emitting elements respectively disposed on the fifth to eighth pixel circuits, wherein one of the fifth to eighth light-emitting elements is the second additional light-emitting element.

7. The display device of claim 6, wherein each of the fifth to eighth light-emitting elements outputs one of red light, green light, and blue light.

8. The display device of claim 6, wherein one of the third and fourth light-emitting elements is the first additional light-emitting element, wherein one of the fifth and sixth light-emitting elements is the second additional light-emitting element.

9. The display device of claim 6, wherein one of the third and fourth light-emitting elements is the first additional light-emitting element, wherein one of the seventh and eighth light-emitting elements is the second additional light-emitting element.

10. The display device of claim 1, wherein the first side data line includes a first data line, a second data line, a third data line and a fourth data line, wherein the first side pixel circuit includes a first pixel circuit, a second pixel circuit, a third pixel circuit and a fourth pixel circuit respectively connected to the first data line, the second data line, the third data line and the fourth data line.

11. The display device of claim 10, wherein the display panel further includes a first light-emitting element, a second light-emitting element, a third light-emitting element and a fourth light-emitting element respectively disposed on the first to fourth pixel circuits, wherein one of the first to fourth light-emitting element is the first additional light-emitting element.

12. The display device of claim 11, wherein the first light-emitting element among the first to fourth light-emitting elements is the first additional light-emitting element, wherein the second and fourth light-emitting elements are respectively connected to the second and third pixel circuits, wherein the third light-emitting element is connected to the first pixel circuit via the first connection wiring.

13. The display device of claim 12, wherein the first light-emitting element outputs red light, wherein each of the second and fourth light-emitting elements outputs green light, wherein the third light-emitting element outputs blue light.

14. The display device of claim 1, wherein the second side data line includes a fifth data line, a sixth data line, a seventh data line, and an eighth data line, wherein the second side pixel circuit includes a fifth pixel circuit, a sixth pixel circuit, a seventh pixel circuit and an eighth pixel circuit respectively connected to the fifth data line, the sixth data line, the seventh data line and the eighth data line.

15. The display device of claim 14, wherein the display panel further includes a fifth light-emitting element, a sixth light-emitting element, a seventh light-emitting element, and an eighth light-emitting element respectively disposed on the fifth to eighth pixel circuits, wherein one of the fifth to eighth light-emitting elements is the second additional light-emitting element.

16. The display device of claim 15, wherein the seventh light-emitting element among the fifth to eighth light-emitting elements is the second additional light-emitting element, wherein the sixth and eighth light-emitting elements are respectively connected to the sixth and eighth pixel circuits, wherein the fifth light-emitting element is connected to the seventh pixel circuit via the second connection wiring.

17. The display device of claim 16, wherein the fifth light-emitting element outputs blue light, wherein each of the sixth and eighth light-emitting elements outputs green light, wherein the seventh light-emitting element outputs red light.

18. The display device of claim 1, wherein each of the first and second additional light-emitting elements includes:

a first electrode;

a light-emitting layer disposed on the first electrode; and a second electrode disposed on the light-emitting layer, wherein the first electrode of the first additional light-emitting element is integrally formed with the first connection wiring, wherein the first electrode of the second additional light-emitting element is integrally formed with the second connection wiring.

19. The display device of claim 18, wherein the second electrode of the first additional light-emitting element is integrally formed with the second electrode of the second additional light-emitting element.

20. The display device of claim 1, wherein the first connection wiring overlaps the first additional data line in a plan view of the display device, wherein the second connection wiring non-overlaps with the second additional data line in the plan view.

21. A display device comprising:

a display panel including a display area including a first area and a second area adjacent to the first area, wherein the second area is divided into a first side area and a second side area around a central axis passing through a center of the first area, wherein the display panel includes:

a first side normal pixel disposed in each of first and second rows of the first side area;

a first side non-normal pixel disposed in the second row among the first and second rows of the first side area;

a second side normal pixel disposed in each of first and second rows of the second side area; and a second side non-normal pixel disposed in the first row among the first and second rows of the second side area, wherein each of the first side non-normal pixel and the second side non-normal pixel further includes a connection wiring connecting a data line and a pixel circuit to each other, wherein each of the first side normal pixel and the second side normal pixel is free of the connection wiring.

22. A display device comprising:

a display panel including a display area including a first area and a second area adjacent to the first area, wherein the second area is divided into a first side area and a second side area around a central axis passing through a center of the first area, wherein the display panel includes:

a first side pixel circuit disposed in the first side area;

a second side pixel circuit disposed in the second side area;

a first light-emitting element disposed in the first side area and connected to the first side pixel circuit via a first connection wiring, wherein a spacing between the central axis and the first light-emitting element is larger than a spacing between the central axis and the first side pixel circuit; and a second light-emitting element disposed in the second side area and connected to the second side pixel circuit via a second connection wiring, wherein a spacing between the central axis and the second light-emitting element is larger than a spacing between the central axis and the second side pixel circuit, wherein the first connection wiring extends in a first extension direction so as to extend away from the central axis, wherein the second connection wiring extends in a second extension direction so as to extend away from the central axis, wherein the second extension direction is opposite to the first extension direction.

* * * * *